(12) United States Patent
Lee et al.

(10) Patent No.: US 9,722,540 B2
(45) Date of Patent: Aug. 1, 2017

(54) METHOD AND APPARATUS FOR SETTING FREQUENCY OF WIRELESS POWER TRANSMISSION

(75) Inventors: Jaesung Lee, Inje-Gun (KR); Bongsik Kwak, Anyang-Si (KR); Yongcheol Park, Gwacheon-Si (KR); Taewook Kwon, Seoul (KR); Seonghun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 442 days.

(21) Appl. No.: 14/374,305

(22) PCT Filed: Jan. 25, 2012

(86) PCT No.: PCT/KR2012/000602
§ 371 (c)(1),
(2), (4) Date: Jul. 24, 2014

(87) PCT Pub. No.: WO2013/111917
PCT Pub. Date: Aug. 1, 2013

(65) Prior Publication Data
US 2014/0368053 A1    Dec. 18, 2014

(51) Int. Cl.
| | | |
|---|---|---|
| H01F 38/00 | (2006.01) | |
| H03C 1/00 | (2006.01) | |
| H02J 5/00 | (2016.01) | |
| H02J 7/00 | (2006.01) | |
| H02J 7/02 | (2016.01) | |
| H01F 38/14 | (2006.01) | |
| H04B 5/00 | (2006.01) | |

(52) U.S. Cl.
CPC ............... *H03C 1/00* (2013.01); *H01F 38/14* (2013.01); *H02J 5/005* (2013.01); *H02J 7/0004* (2013.01); *H02J 7/025* (2013.01); *H04B 5/0037* (2013.01)

(58) Field of Classification Search
USPC .......................................... 307/104
See application file for complete search history.

(56) References Cited

U.S. PATENT DOCUMENTS

2012/0001485 A1   1/2012  Uchida
2013/0062961 A1*  3/2013  Park et al. ............ H02J 50/12
                                                       307/104

FOREIGN PATENT DOCUMENTS

| JP | 10-108391 A | 4/1998 |
| JP | 2006-74848 A | 3/2006 |
| KR | 10-2011-0121623 A | 11/2011 |
| WO | WO 2009/014125 A1 | 1/2009 |

* cited by examiner

*Primary Examiner* — Rexford Barnie
*Assistant Examiner* — Dru Parries
(74) *Attorney, Agent, or Firm* — Birch, Stewart, Kolasch & Birch, LLP

(57) ABSTRACT

The present disclosure relates to a method and apparatus for setting the frequency of wireless power transmission. To this end, the method for setting the frequency of a wireless power transmission apparatus can include the steps of: obtaining power transmission information from the wireless power receiving apparatus receiving a wireless power signal; and setting the transmission frequency of the wireless power signal on the basis of the obtained power transmission information.

17 Claims, 25 Drawing Sheets

(a)

(b)

(c)

METHOD AND APPARATUS FOR SETTING FREQUENCY OF WIRELESS POWER TRANSMISSION

TECHNICAL FIELD

The present disclosure relates to a wireless power transfer, and more particularly, a method and apparatus for setting a frequency based on power transmission information in wireless power transfer.

BACKGROUND ART

In recent years, the method of contactlessly supplying electrical energy to wireless power receivers in a wireless manner has been used instead of the traditional method of supplying electrical energy in a wired manner. The wireless power receiver receiving energy in a wireless manner may be directly driven by the received wireless power, or a battery may be charged by using the received wireless power, then allowing the wireless power receiver to be driven by the charged power.

The Wireless Power Consortium (WPC) which manages technologies for a magnetic inductive wireless power transfer has published a standard document "System description Wireless Power Transfer, Volume 1, Low Power, Part 1: Interface Definition, Version 1.00 Release Candidate 1 (RC1)" for interoperability in the wireless power transfer on Apr. 12, 2010. The standard document of the WPC has described a method of transferring power from one wireless power transmitter to one wireless power receiver by a magnetic induction.

DISCLOSURE OF THE INVENTION

Efficiency or stability of wireless power transfer may depend on a distance between a power transmitter (or transmitting apparatus) and a power receiver (or receiving apparatus), a characteristic of each apparatus, the number of receivers and the like, in wireless power transfer. There is a need of a method for changing a frequency used for power transmission, in order to improve the efficiency or stability in the wireless power transfer or taking into account the characteristic of the receiver.

To achieve these and other advantages and in accordance with the purpose of the present invention, as embodied and broadly described herein, there is provided a method for setting a frequency of a wireless power signal transmitted by a wireless power transmitter, the method including acquiring power transmission information from a wireless power receiver which receives the wireless power signal, and setting a transmission frequency of the wireless power signal based on the acquired power transmission information.

In accordance with one exemplary embodiment disclosed herein, the acquiring of the power transmission information may include transmitting wireless power signals having different frequencies in a sequential manner, and acquiring power transmission information corresponding to each of the sequentially-transmitted wireless power signals.

In accordance with one exemplary embodiment disclosed herein, the power transmission information may include information related to at least one of a receiving side voltage of the wireless power receiver, a receiving side current of the wireless power receiver, a first reference voltage and a second reference voltage.

In accordance with one exemplary embodiment disclosed herein, the first reference voltage may be decided based on whether it is a voltage which is likely to cause damage on the wireless power receiver, and the second reference voltage may be decided based on whether it is a voltage by which the wireless power receiver can receive power from the wireless power transmitter in a wireless manner.

In accordance with one exemplary embodiment disclosed herein, the setting of the transmission frequency may include deciding a transmittable frequency band for the wireless power signal based on the power transmission information, and setting a specific frequency belonging to the decided frequency band as the transmission frequency of the wireless power signal.

In accordance with one exemplary embodiment disclosed herein, the transmittable frequency band may be a frequency band corresponding to a range where the receiving side voltage is less than the first reference voltage and more than the second reference voltage.

In accordance with one exemplary embodiment disclosed herein, the deciding of the transmittable frequency band for the wireless power signal may include generating a transmission profile based on the power transmission information, and deciding the transmittable frequency band of the wireless power signal based on the transmission profile.

In accordance with one exemplary embodiment disclosed herein, the transmission profile may indicate a relationship between at least one of the receiving side voltage, transmission efficiency and transmission gain and a frequency of the wireless power signal.

In accordance with one exemplary embodiment disclosed herein, the specific frequency may be decided such that at least one of the receiving side voltage, transmission efficiency and transmission gain has the maximum value.

In accordance with one exemplary embodiment disclosed herein, the power transmission information may be acquired when at least one of the receiving side voltage, transmission efficiency and transmission gain is below a reference value, when a new wireless power receiver is arranged within a specific region, when the number of wireless power receivers within the specific region changes, when at least one wireless receiver within the specific region changes in location, when the acquisition is carried out in a periodical manner, or when there is a request received from the wireless power receiver. Here, the specific region may be a region through which the wireless power signal passes, or a region where the wireless power receiver is detectable.

In accordance with one exemplary embodiment disclosed herein, the transmission efficiency may be a ratio between transmitted power of the wireless power transmitter and received power of the wireless power receiver, and the transmission gain may be a ratio between a transmitting side voltage of the wireless power transmitter and the receiving side voltage. Here, the received power may be detected based on the receiving side voltage information and the receiving side current information.

In accordance with one exemplary embodiment disclosed herein, the method may further include storing the decided frequency band.

In accordance with one exemplary embodiment disclosed herein, the wireless power receiver may be present in plurality, and the deciding of the transmittable frequency band for the wireless power signal may include generating a plurality of transmission profiles corresponding to the plurality of wireless power receivers, respectively, based on the power transmission information, and deciding the transmittable frequency band for the wireless power signal based on the plurality of transmission profiles.

In accordance with one exemplary embodiment disclosed herein, the deciding of the transmittable frequency band for the wireless power signal based on the plurality of transmission profiles may include selecting at least one transmission profile from the plurality of transmission profiles, and deciding the transmittable frequency band for the wireless power signal based on the selected at least one transmission profile.

In accordance with one exemplary embodiment disclosed herein, the selection of the at least one transmission profile from the plurality of transmission profiles may be carried out based on at least one of whether it is a transmission profile which is likely to cause damage on the wireless power receiver, and whether it is a transmission file by which the wireless power receiver can wirelessly receive power from the wireless power transmitter.

In accordance with one exemplary embodiment disclosed herein, the deciding of the transmittable frequency band for the wireless power signal based on the plurality of transmission profiles may include generating a reference transmission profile based on the plurality of transmission profiles, and deciding the transmittable frequency band for the wireless power signal based on the generated reference transmission profile.

In accordance with one exemplary embodiment disclosed herein, the reference transmission profile may be generated by processing the plurality of transmission profiles in a statistical manner.

In accordance with one exemplary embodiment disclosed herein, the statistical manner may be a method performed based on at least one of an average, distribution, and standard deviation of the plurality of transmission profiles.

A wireless power transmitter in accordance with this specification to achieve those objectives and other features may include a power transfer unit that is configured to transmit a wireless power signal, and acquire power transmission information from a wireless power receiver which receives the wireless power signal, and a controller that is configured to decide a transmittable frequency band for the wireless power signal based on the power transmission information, set a specific frequency belonging to the decided frequency band as a transmission frequency of the wireless power signal, and transmit the wireless power signal corresponding to the set transmission frequency to the wireless power receiver.

In accordance with one exemplary embodiment disclosed herein, the power transfer unit may transmit wireless power signals having different frequencies in a sequential manner, and acquire power transmission information corresponding to each of the sequentially-transmitted wireless power signals.

Advantageous Effect

A wireless power transmitter to which a frequency setting method in accordance with the detailed description is applied may be allowed to decide a frequency which improves transmission efficiency or stability of wireless power, taking into account a frequency split characteristic, which is caused between a wireless power transmitter and a wireless power receiver.

Also, a wireless power transmitter to which a frequency setting method in accordance with the detailed description is applied may be allowed to decide a frequency which exhibits more than a predetermined level of transmission efficiency.

In addition, a wireless power transmitter to which a frequency setting method in accordance with the detailed description is applied may be allowed to decide a frequency which does not cause damage on a wireless power receiver according to a characteristic of the wireless power receiver.

BRIEF DESCRIPTION OF THE DRAWINGS

FIGS. 15, 16A and 16B through 19 are views illustrating the structure of packets including a power control message between a wireless power transmitter 100 and an electronic device 200.

MODES FOR CARRYING OUT THE PREFERRED EMBODIMENTS

Figure 1:
FIG. 1 is an exemplary view conceptually illustrating a wireless power transmitter and an electronic device according to the embodiments of the present invention.

The technologies disclosed herein may be applicable to wireless power transfer (contactless power transfer). However, the technologies disclosed herein are not limited to this, and may be also applicable to all kinds of power transmission systems and methods, wireless charging circuits and methods to which the technological spirit of the technology can be applicable, in addition to the methods and apparatuses using power transmitted in a wireless manner.

It should be noted that technological terms used herein are merely used to describe a specific embodiment, but not to limit the present invention. Also, unless particularly defined otherwise, technological terms used herein should be construed as a meaning that is generally understood by those having ordinary skill in the art to which the invention pertains, and should not be construed too broadly or too narrowly. Furthermore, if technological terms used herein are wrong terms unable to correctly express the spirit of the invention, then they should be replaced by technological terms that are properly understood by those skilled in the art. In addition, general terms used in this invention should be construed based on the definition of dictionary, or the context, and should not be construed too broadly or too narrowly.

Incidentally, unless clearly used otherwise, expressions in the singular number include a plural meaning. In this application, the terms "comprising" and "including" should not be construed to necessarily include all of the elements or steps disclosed herein, and should be construed not to include some of the elements or steps thereof, or should be construed to further include additional elements or steps.

In addition, a suffix "module" or "unit" used for constituent elements disclosed in the following description is merely intended for easy description of the specification, and the suffix itself does not give any special meaning or function.

Furthermore, the terms including an ordinal number such as first, second, etc. can be used to describe various elements, but the elements should not be limited by those terms. The terms are used merely for the purpose to distinguish an element from the other element. For example, a first element may be named to a second element, and similarly, a second element may be named to a first element without departing from the scope of right of the invention.

Hereinafter, preferred embodiments of the present invention will be described in detail with reference to the accompanying drawings, and the same or similar elements are designated with the same numeral references regardless of the numerals in the drawings and their redundant description will be omitted.

In describing the present invention, moreover, the detailed description will be omitted when a specific description for publicly known technologies to which the invention pertains is judged to obscure the gist of the present invention. Also, it should be noted that the accompanying drawings are merely illustrated to easily explain the spirit of the invention, and therefore, they should not be construed to limit the spirit of the invention by the accompanying drawings.

FIG. 1 is an exemplary view conceptually illustrating a wireless power transmitter and an electronic device according to the embodiments of the present invention.

Referring to FIG. 1, the wireless power transmitter 100 may be a power transfer apparatus configured to transfer power required for the electronic device 200 in a wireless manner.

Furthermore, the wireless power transmitter 100 may be a wireless charging apparatus configured to charge a battery of the electronic device 200 by transferring power in a wireless manner. A case where the wireless power transmitter 100 is a wireless charging apparatus will be described later with reference to FIG. 9.

Additionally, the wireless power transmitter 100 may be implemented with various forms of apparatuses transferring power to the electronic device 200 requiring power in a contactless state.

The electronic device 200 is a device that is operable by receiving power from the wireless power transmitter 100 in a wireless manner. Furthermore, the electronic device 200 may charge a battery using the received wireless power.

On the other hand, an electronic device for receiving power in a wireless manner as described herein should be construed broadly to include a portable phone, a cellular phone, a smart phone, a personal digital assistant (PDA), a portable multimedia player (PMP), a tablet, a multimedia device, or the like, in addition to an input/output device such as a keyboard, a mouse, an audio-visual auxiliary device, and the like.

The electronic device 200, as described later, may be a mobile communication terminal, (for example, a portable phone, a cellular phone, and a tablet or multimedia device). In case where the electronic device is a mobile terminal, it will be described later with reference to FIG. 10.

On the other hand, the wireless power transmitter 100 may transfer power in a wireless manner without mutual contact to the electronic device 200 using one or more wireless power transfer methods. In other words, the wireless power transmitter 100 may transfer power using at least one of an inductive coupling method based on magnetic induction phenomenon by the wireless power signal and a magnetic resonance coupling method based on electromagnetic resonance phenomenon by a wireless power signal at a specific frequency.

Wireless power transfer in the inductive coupling method is a technology transferring power in a wireless manner using a primary coil and a secondary coil, and refers to the transmission of power by inducing a current from a coil to another coil through a changing magnetic field by a magnetic induction phenomenon.

Wireless power transfer in the inductive coupling method refers to a technology in which the electronic device 200 generates resonance by a wireless power signal transmitted from the wireless power transmitter 100 to transfer power from the wireless power transmitter 100 to the wireless power receiver 200 by the resonance phenomenon.

Hereinafter, the wireless power transmitter 100 and electronic device 200 according to the embodiments disclosed herein will be described in detail. In assigning reference numerals to the constituent elements in each of the following drawings, the same reference numerals will be used for the same constituent elements even though they are shown in a different drawing.

FIG. 2 is an exemplary block diagram illustrating the configuration of a wireless power transmitter 100 and an electronic device 200 that can be employed in the embodiments disclosed herein.

Figure 2A:
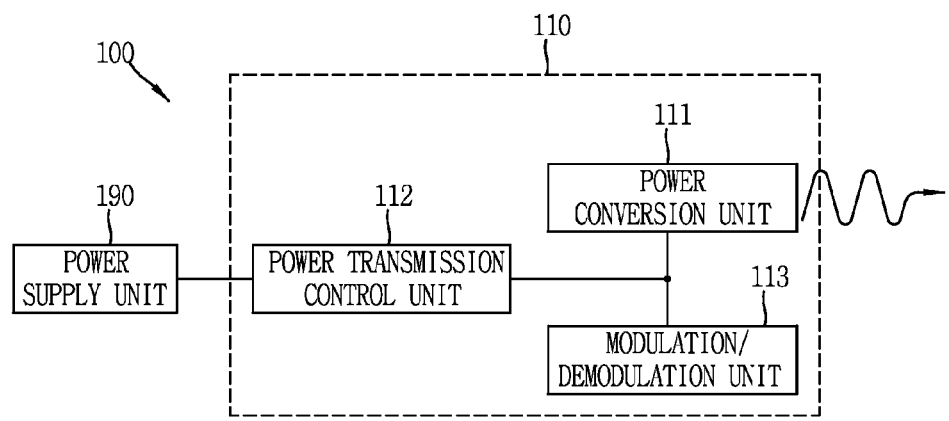
FIGS. 2A and 2B are exemplary block diagrams illustrating the configuration of a wireless power transmitter 100 and an electronic device 200 that can be employed in the embodiments disclosed herein, respectively.

Referring to FIG. 2A, the wireless power transmitter 100 may include a power transmission unit 110. The power transmission unit 110 may include a power conversion unit 111 and a power transmission control unit 112.

The power conversion unit 111 transfers power supplied from a transmission side power supply unit 190 to the electronic device 200 by converting it into a wireless power signal. The wireless power signal transferred by the power conversion unit 111 is generated in the form of a magnetic field or electro-magnetic field having an oscillation characteristic. For this purpose, the power conversion unit 111 may be configured to include a coil for generating the wireless power signal.

The power conversion unit 111 may include a constituent element for generating a different type of wireless power signal according to each power transfer method.

In accordance with exemplary embodiments, the power conversion unit 111 may include a primary coil for forming a changing magnetic field to induce a current to a secondary coil of the electronic device 200. Furthermore, the power conversion unit 111 may include a coil (or antenna) for forming a magnetic field having a specific resonant frequency to generate a resonant frequency in the electronic device 200 according to the resonance coupling method.

Furthermore, the power conversion unit 111 may transfer power using at least one of the foregoing inductive coupling method and the resonance coupling method.

Among the constituent elements included in the power conversion unit 111, those for the inductive coupling method will be described later with reference to FIGS. 4 and 5, and those for the resonance coupling method will be described with reference to FIGS. 7 and 8.

On the other hand, the power conversion unit 111 may further include a circuit for controlling the characteristics of a used frequency, an applied voltage, an applied current or the like to form the wireless power signal.

The power transmission control unit 112 controls each of the constituent elements included in the power transmission unit 110 The power transmission control unit 112 may be implemented to be integrated into another control unit (not shown) for controlling the wireless power transmitter 100.

On the other hand, a region to which the wireless power signal can be approached may be divided into two types. First, an active area denotes a region through which a wireless power signal transferring power to the electronic device 200 is passed. Next, a semi-active area denotes an interest region in which the wireless power transmitter 100 can detect the existence of the electronic device 200. Here, the power transmission control unit 112 may detect whether the electronic device 200 is placed in the active area or detection area or removed from the area. Specifically, the power transmission control unit 112 may detect whether or not the electronic device 200 is placed in the active area or detection area using a wireless power signal formed from the power conversion unit 111 or a sensor separately provided therein. For instance, the power transmission control unit 112 may detect the presence of the electronic device 200 by monitoring whether or not the characteristic of power for forming the wireless power signal is changed by the wireless power signal, which is affected by the electronic device 200 existing in the detection area. However, the active area and detection area may vary according to the wireless power transfer method such as an inductive coupling method, a resonance coupling method, and the like.

The power transmission control unit 112 may perform the process of identifying the electronic device 200 or determine whether to start wireless power transfer according to a result of detecting the existence of the electronic device 200.

Furthermore, the power transmission control unit 112 may determine at least one characteristic of a frequency, a voltage, and a current of the power conversion unit 111 for forming the wireless power signal. The determination of the characteristic may be carried out by a condition at the side of the wireless power transmitter 100 or a condition at the side of the electronic device 200. In exemplary embodiments, the power transmission control unit 112 may decide the characteristic based on device identification information. In another exemplary embodiment, the power transmission control unit 112 may decide the characteristic based on required power information of the electronic device 200 or profile information related to the required power. The power transmission control unit 112 may receive a power control message from the electronic device 200. The power transmission control unit 112 may determine at least one characteristic of a frequency, a voltage and a current of the power conversion unit 111 based on the received power control message, and additionally perform other control operations based on the power control message.

For example, the power transmission control unit 112 may determine at least one characteristic of a frequency, a voltage and a current used to form the wireless power signal according to the power control message including at least one of rectified power amount information, charging state information and identification information in the electronic device 200.

The power transmission control unit 112 may execute scanning for frequencies belonging to a predetermined range by controlling the power conversion unit 111, in order to acquire frequency-based power transmission information relating to a wireless power receiver which is arranged in the active area or the detection area.

The scanning may refer to an operation or method of checking changes in the power transmission information according to changes of frequencies of wireless power signals. For example, the scanning may refer to an operation that the wireless power transmitter 100 sequentially transmits wireless power signals having different frequencies and the wireless power receiver 100 acquires power transmission information corresponding to each of the sequentially-transmitted wireless power signals.

The power transmission information may include information related to at least one of a receiving side voltage of the wireless power receiver, a receiving side current of the wireless power receiver, a first reference voltage and a second reference voltage.

Here, the first reference voltage may be decided based on whether it is a voltage which is likely to cause damage on the wireless power receiver, and the second reference voltage may be decided based on whether it is a voltage by which the wireless power receiver can receive power from the wireless power transmitter in a wireless manner.

Furthermore, as another control operation using the power control message, the wireless power transmitter 100 may perform a typical control operation associated with wireless power transfer based on the power control message. For example, the wireless power transmitter 100 may receive information associated with the electronic device 200 to be auditorily or visually outputted through the power control message, or receive information required for authentication between devices.

In exemplary embodiments, the power transmission control unit 112 may receive the power control message through the wireless power signal. In other exemplary embodiment, the power transmission control unit 112 may receive the power control message through a method for receiving user data.

In order to receive the foregoing power control message, the wireless power transmitter 100 may further include a modulation/demodulation unit 113 electrically connected to the power conversion unit 111. The modulation/demodulation unit 113 may modulate a wireless power signal that has been modulated by the electronic device 200 and use it to receive the power control message. The method for allowing the power conversion unit 111 to receive a power control message using a wireless power signal will be described later with reference to FIGS. 11 through 13.

In addition, the power transmission control unit 112 may acquire a power control message by receiving user data including a power control message by a communication means (not shown) included in the wireless power transmitter 100.

Figure 2B:
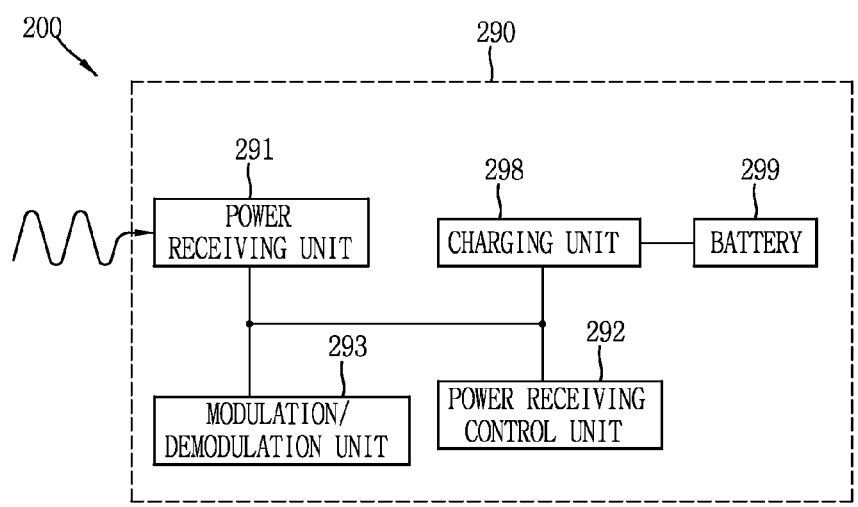

FIG. 2B—Electronic Device

Referring to FIG. 2B, the electronic device 200 may include a power supply unit 290. The power supply unit 290 supplies power required for the operation of the electronic device 200. The power supply unit 290 may include a power receiving unit 291 and a power reception control unit (or POWER RECEIVING CONTROL UNIT) 292.

The power receiving unit 291 receives power transferred from the wireless power transmitter 100 in a wireless manner.

The power receiving unit 291 may include constituent elements required to receive the wireless power signal according to a wireless power transfer method. Furthermore, the power receiving unit 291 may receive power according to at least one wireless power transfer method, and in this case, the power receiving unit 291 may include constituent elements required for each method.

First, the power receiving unit 291 may include a coil for receiving a wireless power signal transferred in the form of a magnetic field or electromagnetic field having a vibration characteristic.

For instance, as a constituent element according to the inductive coupling method, the power receiving unit 291 may include a secondary coil to which a current is induced by a changing magnetic field. In exemplary embodiments, the power receiving unit 291, as a constituent element according to the resonance coupling method, may include a coil and a resonant circuit in which resonance phenomenon is generated by a magnetic field having a specific resonant frequency.

In another exemplary embodiments, when the power receiving unit 291 receives power according to at least one wireless power transfer method, the power receiving unit 291 may be implemented to receive power by using a coil, or implemented to receive power by using a coil formed differently according to each power transfer method.

Among the constituent elements included in the power receiving unit 291, those for the inductive coupling method will be described later with reference to FIG. 4, and those for the resonance coupling method with reference to FIG. 7.

On the other hand, the power receiving unit 291 may further include a rectifier and a regulator to convert the wireless power signal into a direct current. Furthermore, the power receiving unit 291 may further include a circuit for protecting an overvoltage or overcurrent from being generated by the received power signal.

The power receiving control unit 292 may control each constituent element included in the power supply unit 290.

Specifically, the power receiving control unit 292 may transfer a power control message to the wireless power transmitter 100. The power control message may instruct the wireless power transmitter 100 to initiate or terminate a transfer of the wireless power signal. Furthermore, the power control message may instruct the wireless power transmitter 100 to control a characteristic of the wireless power signal.

In exemplary embodiments, the power receiving control unit 292 may transmit the power control message through the wireless power signal. In another exemplary embodiment, the power receiving control unit 292 may transmit the power control message through a method for transmitting user data.

In order to transmit the foregoing power control message, the electronic device 200 may further include a modulation/demodulation unit 293 electrically connected to the power receiving unit 291. The modulation/demodulation unit 293, similarly to the case of the wireless power transmitter 100, may be used to transmit the power control message through the wireless power signal. The modulation/demodulation unit 293 may be used as a means for controlling a current and/or voltage flowing through the power conversion unit 111 of the wireless power transmitter 100. Hereinafter, a method for allowing the modulation/demodulation unit 113 or 293 at the side of the wireless power transmitter 100 and at the side of the electronic device 200, respectively, to be used to transmit and receive a power control message through a wireless power signal will be described.

A wireless power signal formed by the power conversion unit 111 is received by the power receiving unit 291. At this time, the power receiving control unit 292 controls the modulation/demodulation unit 293 at the side of the electronic device 200 to modulate the wireless power signal. For instance, the power receiving control unit 292 may perform a modulation process such that a power amount received from the wireless power signal is varied by changing a reactance of the modulation/demodulation unit 293 connected to the power receiving unit 291. The change of a power amount received from the wireless power signal results in the change of a current and/or voltage of the power conversion unit 111 for forming the wireless power signal. At this time, the modulation/demodulation unit 113 at the side of the wireless power transmitter 100 may detect a change of the current and/or voltage to perform a demodulation process.

In other words, the power receiving control unit 292 may generate a packet including a power control message intended to be transferred to the wireless power transmitter 100 and modulate the wireless power signal to allow the packet to be included therein, and the power transmission control unit 112 may decode the packet based on a result of performing the demodulation process of the modulation/demodulation unit 113 to acquire the power control message included in the packet. The detailed method of allowing the wireless power transmitter 100 to acquire the power control message will be described later with reference to FIGS. 11 through 13.

In addition, the power receiving control unit 292 may transmit a power control message to the wireless power transmitter 100 by transmitting user data including the power control message by a communication means (not shown) included in the electronic device 200.

In addition, the power supply unit 290 may further include a charger 298 and a battery 299.

The electronic device 200 receiving power for operation from the power supply unit 290 may be operated by power transferred from the wireless power transmitter 100, or operated by charging the battery 299 using the transferred power and then receiving the charged power. At this time, the power receiving control unit 292 may control the charger 298 to perform charging using the transferred power.

Hereinafter, a wireless power transmitter and an electronic device applicable to the embodiments disclosed herein will be described.

First, a method of allowing the wireless power transmitter to transfer power to the electronic device according to the inductive coupling method will be described with reference to FIGS. 3 through 5.

Figure 3:
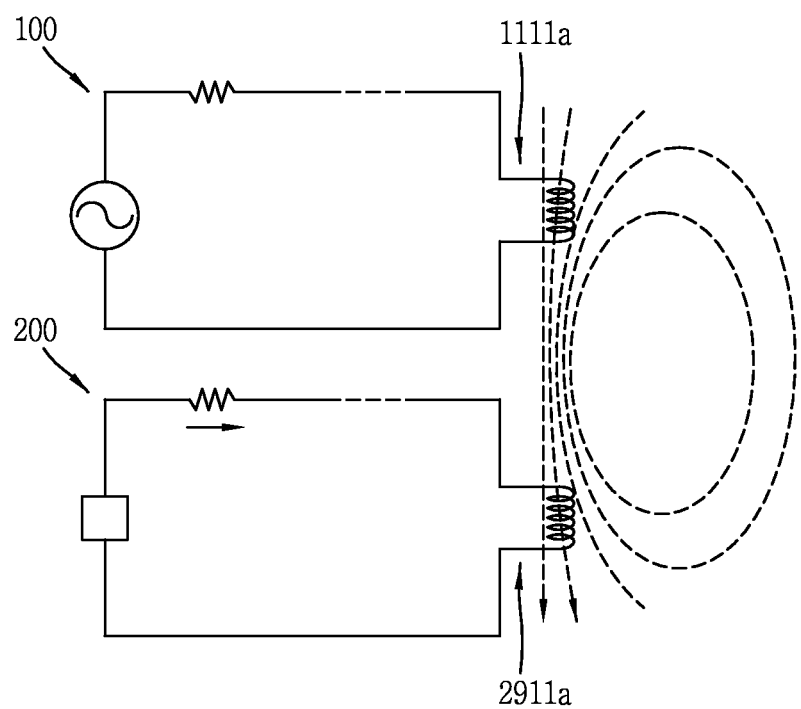
FIG. 3 is a view illustrating a concept in which power is transferred from a wireless power transmitter to an electronic device in a wireless manner according to an inductive coupling method.

FIG. 3 is a view illustrating a concept in which power is transferred from a wireless power transmitter to an electronic device in a wireless manner according to an inductive coupling method.

When the power of the wireless power transmitter 100 is transferred in an inductive coupling method, if the strength of a current flowing through a primary coil within the power transmission unit 110 is changed, then a magnetic field passing through the primary coil may be changed by the current. The changed magnetic field generates an induced electromotive force at a secondary coil in the electronic device 200.

According to the foregoing method, the power conversion unit 111 of the wireless power transmitter 100 may include a transmitting (Tx) coil 1111a being operated as a primary coil in magnetic induction. Furthermore, the power receiving unit 291 of the electronic device 200 may include a receiving (Rx) coil 2911a being operated as a secondary coil in magnetic induction.

First, the wireless power transmitter 100 and electronic device 200 are disposed in such a manner that the transmitting coil 1111a at the side of the wireless power transmitter 100 and the receiving coil at the side of the electronic device 200 are located adjacent to each other. Then, if the power transmission control unit 112 controls a current of the transmitting coil 1111a to be changed, then the power receiving unit 291 controls power to be supplied to the electronic device 200 using an electromotive force induced to the receiving coil 2911a.

The efficiency of wireless power transfer by the inductive coupling method may be little affected by a frequency characteristic, but affected by an alignment and distance between the wireless power transmitter 100 and the electronic device 200 including each coil.

On the other hand, in order to perform wireless power transfer in the inductive coupling method, the wireless power transmitter 100 may be configured to include an interface surface (not shown) in the form of a flat surface. One or more electronic devices may be placed at an upper portion of the interface surface, and the transmitting coil 1111a may be mounted at a lower portion of the interface surface. In this case, a vertical spacing is formed in a small-scale between the transmitting coil 1111a mounted at a lower portion of the interface surface and the receiving coil 2911a of the electronic device 200 placed at an upper portion of the interface surface, and thus a distance between the coils becomes sufficiently small to efficiently implement contactless power transfer by the inductive coupling method.

Furthermore, an alignment indicator (not shown) indicating a location where the electronic device 200 is to be placed at an upper portion of the interface surface. The alignment indicator indicates a location of the electronic device 200 where an alignment between the transmitting coil 1111a mounted at a lower portion of the interface surface and the receiving coil 2911a can be suitably implemented. The alignment indicator may alternatively be simple marks, or may be formed in the form of a protrusion structure for guiding the location of the electronic device 200. Otherwise, the alignment indicator may be formed in the form of a magnetic body such as a magnet mounted at a lower portion of the interface surface, thereby guiding the coils to be suitably arranged by mutual magnetism to a magnetic body having an opposite polarity mounted within the electronic device 200.

On the other hand, the wireless power transmitter 100 may be formed to include one or more transmitting coils. The wireless power transmitter 100 may selectively use some of coils suitably arranged with the receiving coil 2911a of the electronic device 200 among the one or more transmitting coils to enhance the power transmission efficiency. The wireless power transmitter 100 including the one or more transmitting coils will be described later with reference to FIG. 5.

Hereinafter, a configuration of the wireless power transmitter and electronic device using an inductive coupling method applicable to the embodiments disclosed herein will be described in detail.

Figure 4A:
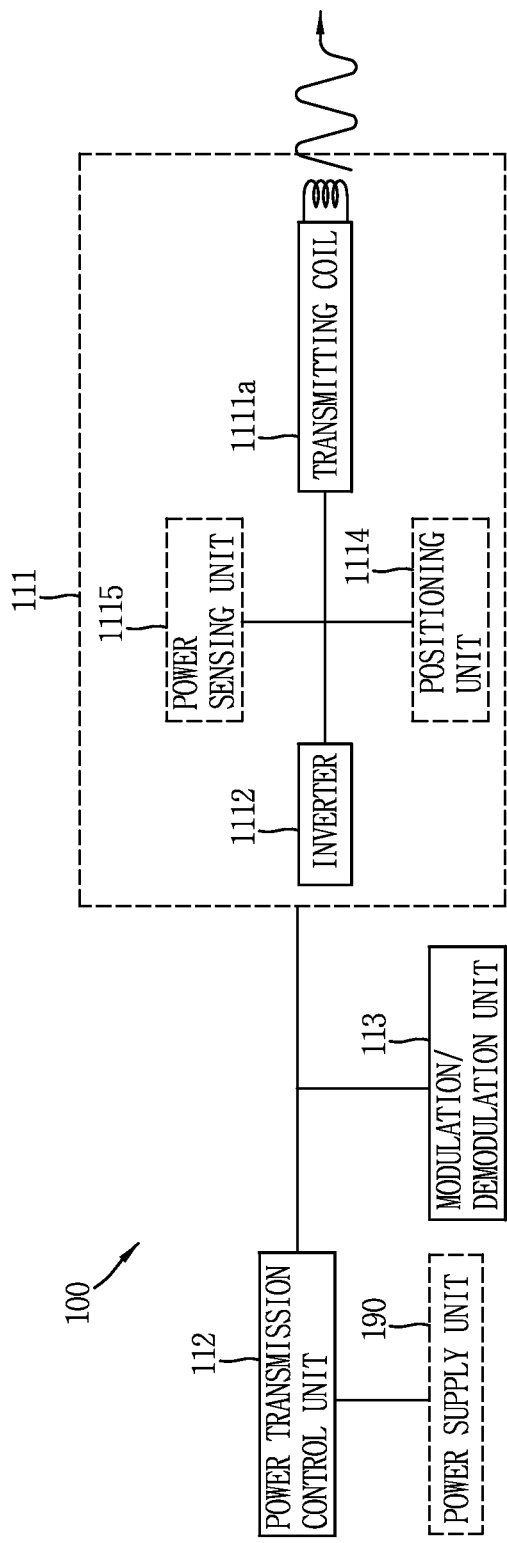
FIGS. 4A and 4B are block diagrams illustrating part of the wireless power transmitter 100 and the electronic device 200 in a magnetic induction method that can be employed in the embodiments disclosed herein.
Figure 4B:
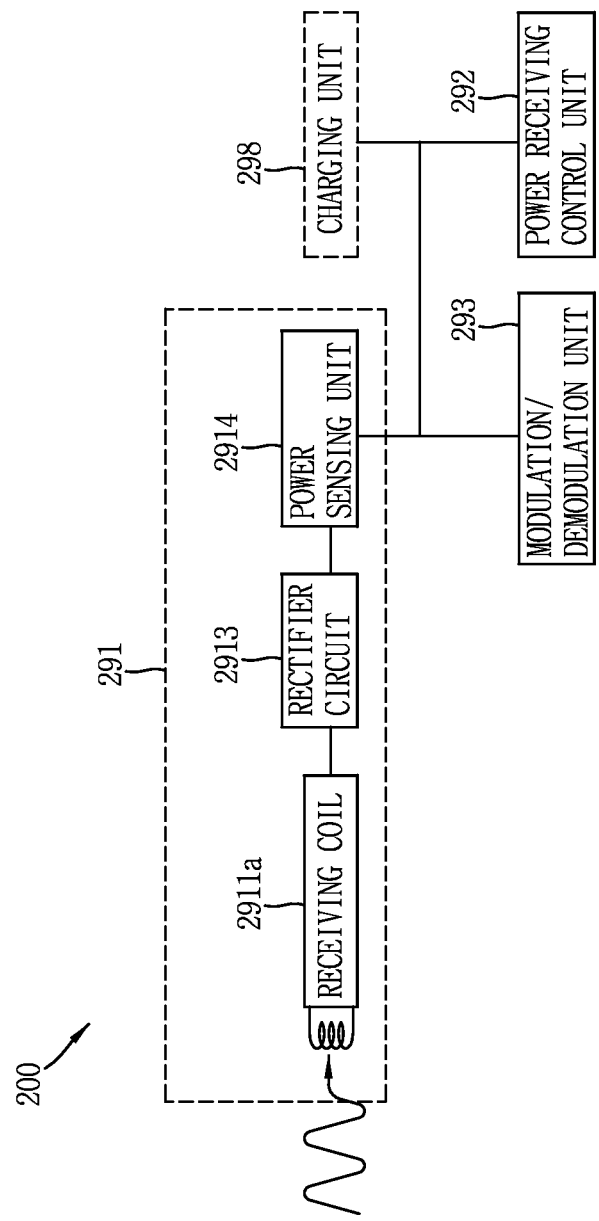

FIG. 4 is a block diagram illustrating part of the wireless power transmitter 100 and the electronic device 200 in a magnetic induction method that can be employed in the embodiments disclosed herein. A configuration of the power transmission unit 110 included in the wireless power transmitter 100 will be described with reference to FIG. 4A, and a configuration of the power supply unit 290 included in the electronic device 200 will be described with reference to FIG. 4B.

Referring to FIG. 4A, the power conversion unit 111 of the wireless power transmitter 100 may include a transmitting (Tx) coil 1111a and an inverter 1112.

The transmitting coil 1111a may form a magnetic field corresponding to the wireless power signal according to a change of current as described above. The transmitting coil 1111a may alternatively be implemented with a planar spiral type or cylindrical solenoid type.

The inverter 1112 transforms a DC input obtained from the power supply unit 190 into an AC waveform. The AC current transformed by the inverter 1112 drives a resonant circuit including the transmitting coil 1111a and a capacitor (not shown) to form a magnetic field in the transmitting coil 1111a.

In addition, the power conversion unit 111 may further include a positioning unit 1114.

The positioning unit 1114 may move or rotate the transmitting coil 1111a to enhance the effectiveness of contactless power transfer using the inductive coupling method. As described above, it is because an alignment and distance between the wireless power transmitter 100 and the electronic device 200 including a primary coil and a secondary coil may affect power transfer using the inductive coupling method. In particular, the positioning unit 1114 may be used when the electronic device 200 does not exist within an active area of the wireless power transmitter 100.

Accordingly, the positioning unit 1114 may include a drive unit (not shown) for moving the transmitting coil 1111a such that a center-to-center distance of the transmitting coil 1111a of the wireless power transmitter 100 and the receiving coil 2911a of the electronic device 200 is within a predetermined range, or rotating the transmitting coil 1111a such that the centers of the transmitting coil 1111a and the receiving coil 2911a are overlapped with each other.

For this purpose, the wireless power transmitter 100 may further include a detection unit (not shown) made of a sensor for detecting the location of the electronic device 200, and the power transmission control unit 112 may control the positioning unit 1114 based on the location information of the electronic device 200 received from the location detection sensor.

Furthermore, to this end, the power transmission control unit 112 may receive control information on an alignment or distance to the electronic device 200 through the modulation/demodulation unit 113, and control the positioning unit 1114 based on the received control information on the alignment or distance.

If the power conversion unit 111 is configured to include a plurality of transmitting coils, then the positioning unit 1114 may determine which one of the plurality of transmitting coils is to be used for power transmission. The configuration of the wireless power transmitter 100 including the plurality of transmitting coils will be described later with reference to FIG. 5.

On the other hand, the power conversion unit 111 may further include a power sensing unit 1115. The power sensing unit 1115 at the side of the wireless power transmitter 100 monitors a current or voltage flowing into the transmitting coil 1111a. The power sensing unit 1115 is provided to check whether or not the wireless power transmitter 100 is normally operated, and thus the power sensing unit 1115 may detect a voltage or current of the power supplied from the outside, and check whether the detected voltage or current exceeds a threshold value. The power sensing unit 1115, although not shown, may include a resistor for detecting a voltage or current of the power supplied from the outside and a comparator for comparing a voltage value or current value of the detected power with a threshold value to output the comparison result. Based on the check result of the power sensing unit 1115, the power transmission control unit 112 may control a switching unit (not shown) to cut off power applied to the transmitting coil 1111a.

Referring to FIG. 4B, the power supply unit 290 of the electronic device 200 may include a receiving (Rx) coil 2911a and a rectifier generation circuit 2913.

A current is induced into the receiving coil 2911a by a change of the magnetic field formed in the transmitting coil 1111a. The implementation type of the receiving coil 2911a may be a planar spiral type or cylindrical solenoid type similarly to the transmitting coil 1111a.

Furthermore, series and parallel capacitors may be configured to be connected to the receiving coil 2911a to enhance the effectiveness of wireless power reception or perform resonant detection.

The receiving coil 2911a may be in the form of a single coil or a plurality of coils.

The rectifier generation circuit 2913 performs a full-wave rectification to a current to convert alternating current into direct current. The rectifier generation circuit 2913, for instance, may be implemented with a full-bridge rectifier generation circuit made of four diodes or a circuit using active components.

In addition, the rectifier generation circuit 2913 may further include a regulator circuit for converting a rectified current into a more flat and stable direct current. Furthermore, the output power of the rectifier generation circuit 2913 is supplied to each constituent element of the power supply unit 290. Furthermore, the rectifier generation circuit 2913 may further include a DC-DC converter for converting output DC power into a suitable voltage to adjust it to the power required for each constituent element (for instance, a circuit such as a charger 298).

The modulation/demodulation unit 293 may be connected to the power receiving unit 291, and may be configured with a resistive element in which resistance varies with respect to direct current, and may be configured with a capacitive element in which reactance varies with respect to alternating current. The power receiving control unit 292 may change the resistance or reactance of the power communications modulation/demodulation unit 293 to modulate a wireless power signal received to the power receiving unit 291.

On the other hand, the power supply unit 290 may further include a power sensing unit 2914. The power sensing unit 2914 at the side of the electronic device 200 monitors a voltage and/or current of the power rectified by the rectifier generation circuit 2913, and if the voltage and/or current of the rectified power exceeds a threshold value as a result of monitoring, then the power receiving control unit 292 transmits a power control message to the wireless power transmitter 100 to transfer suitable power.

Figure 5:
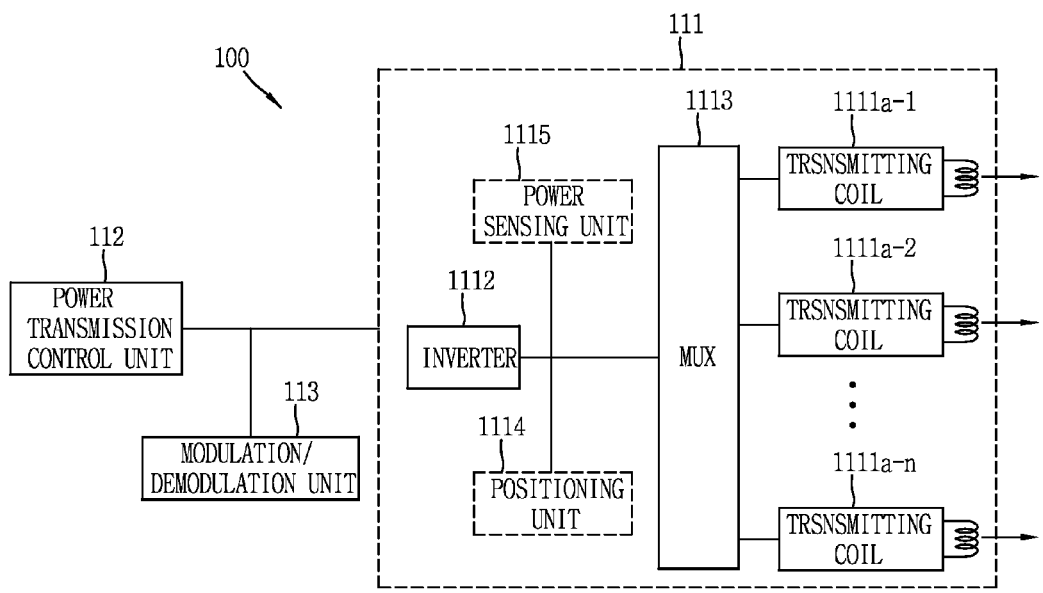
FIG. 5 is a block diagram illustrating a wireless power transmitter configured to have one or more transmitting coils receiving power according to an inductive coupling method that can be employed in the embodiments disclosed herein.

FIG. 5 is a block diagram illustrating a wireless power transmitter configured to have one or more transmission coils receiving power according to an inductive coupling method that can be employed in the embodiments disclosed herein.

Referring to FIG. 5, the power conversion unit 111 of the wireless power transmitter 100 according to the embodiments disclosed herein may include one or more transmitting coils 1111a-1 to 1111a-n. The one or more transmitting coils 1111a-1 to 1111a-n may be an array of partly overlapping primary coils. An active area may be determined by some of the one or more transmitting coils.

The one or more transmitting coils 1111a-1 to 1111a-n may be mounted at a lower portion of the interface surface. Furthermore, the power conversion unit 111 may further include a multiplexer 1113 for establishing and releasing the connection of some of the one or more transmitting coils 1111a-1 to 1111a-n.

Upon detecting the location of the electronic device 200 placed at an upper portion of the interface surface, the power transmission control unit 112 may take the detected location of the electronic device 200 into consideration to control the multiplexer 1113, thereby allowing coils that can be placed in an inductive coupling relation to the receiving coil 2911a of the electronic device 200 among the one or more transmitting coils 1111a-1 to 1111a-n to be connected to one another.

For this purpose, the power transmission control unit 112 may acquire the location information of the electronic device 200. For example, the power transmission control unit 112 may acquire the location of the electronic device 200 on the interface surface by the location detection unit (not shown) provided in the wireless power transmitter 100. For another example, the power transmission control unit 112 may alternatively receive a power control message indicating a strength of the wireless power signal from an object on the interface surface or a power control message indicating the identification information of the object using the one or more transmitting coils 1111a-1 to 1111a-n, respectively, and determines whether it is located adjacent to which one of the one or more transmitting coils based on the received result, thereby acquiring the location information of the electronic device 200.

On the other hand, the active area as part of the interface surface may denote a portion through which a magnetic field with a high efficiency can pass when the wireless power transmitter 100 transfers power to the electronic device 200 in a wireless manner. At this time, a single transmitting coil or one or a combination of more transmitting coils forming a magnetic field passing through the active area may be designated as a primary cell. Accordingly, the power transmission control unit 112 may determine an active area based on the detected location of the electronic device 200, and establish the connection of a primary cell corresponding to the active area to control the multiplexer 1113, thereby allowing the receiving coil 2911a of the electronic device 200 and the coils belonging to the primary cell to be placed in an inductive coupling relation.

In the meantime, upon disposing one or more electronic devices 200 on an interface surface of the wireless power transmitter 100, which includes the one or more transmitting coils 1111a-1 to 1111a-n, the power transmission control unit 112 may control the multiplexer 1113 to allow the coils belonging to the primary cell corresponding to the position of each electronic device to be placed in the inductive coupling relation. Accordingly, the wireless power transmitter 100 may generate the wireless power signal using different coils, thereby transferring it to the one or more electronic devices in a wireless manner.

Also, the power transmission control unit 112 may set power having a different characteristic to be supplied to each of the coils corresponding to the electronic devices. Here, the wireless power transmitter 100 may transfer power by differently setting a power transfer scheme, efficiency, characteristic and the like for each electronic device. The power transmission for one or more electronic devices will be described later with reference to FIG. 8.

Furthermore, the power conversion unit 111 may further include an impedance matching unit (not shown) for controlling an impedance to form a resonant circuit with the coils connected thereto.

Hereinafter, a method for allowing a wireless power transmitter to transfer power according to a resonance coupling method will be disclosed with reference to FIGS. 6 through 8.

Figure 6:
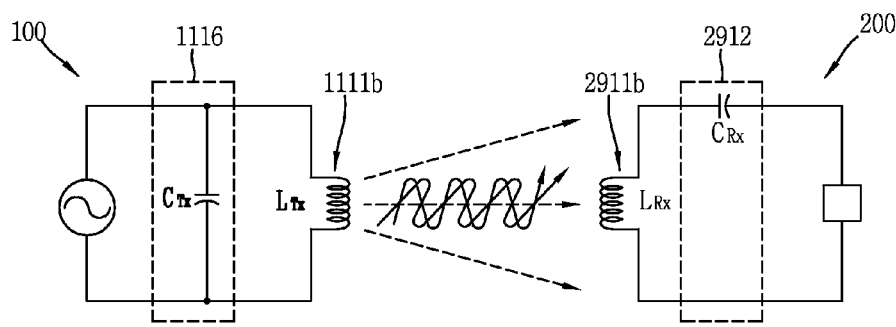
FIG. 6 is a view illustrating a concept in which power is transferred to a wireless power receiver from a wireless power transmitter in a wireless manner according to a resonance coupling method.

FIG. 6 is a view illustrating a concept in which power is transferred to an electronic device from a wireless power transmitter in a wireless manner according to a resonance coupling method.

First, resonance will be described in brief as follows. Resonance refers to a phenomenon in which an amplitude of vibration is remarkably increased when periodically receiving an external force having the same frequency as the natural frequency of a vibration system. Resonance is a phenomenon occurring at all kinds of vibrations such as mechanical vibration, electric vibration, and the like. Generally, when exerting a vibratory force to a vibration system from the outside, if the natural frequency thereof is the same as a frequency of the externally applied force, then the vibration becomes strong, thus increasing the width.

With the same principle, when a plurality of vibrating bodies separated from one another within a predetermined distance vibrate at the same frequency, the plurality of vibrating bodies resonate with one another, and in this case, resulting in a reduced resistance between the plurality of vibrating bodies. In an electrical circuit, a resonant circuit can be made by using an inductor and a capacitor.

When the wireless power transmitter 100 transfers power according to the inductive coupling method, a magnetic field having a specific vibration frequency is formed by alternating current power in the power transmission unit 110. If a resonance phenomenon occurs in the electronic device 200 by the formed magnetic field, then power is generated by the resonance phenomenon in the electronic device 200.

Describing a principle of the resonance coupling, in general, a method for transferring power by generating an electromagnetic wave exhibits low power transmission efficiency, and is likely to have a bad influence on human being due to a radiative property of radiation and exposure to radiation.

However, if the plurality of vibrating bodies resonate with each other in an electromagnetic manner as aforementioned, extremely high power transmission efficiency may be exhibited due to non affection by adjacent objects except for the vibrating bodies. An energy tunnel may be generated between the plurality of vibrating bodies which resonate with each other in the electromagnetic manner. This may be referred to as energy coupling or energy tail.

The resonance coupling disclosed herein may use an electromagnetic wave having a low frequency. When power is transferred using the electromagnetic wave having the low frequency, only a magnetic field may affect an area located within a single wavelength of the electromagnetic wave. This may be referred to as magnetic coupling or magnetic resonance. The magnetic resonance may be generated when the wireless power transmitter 100 and the electronic device 200 are located within the single wavelength of the electromagnetic wave having the low frequency.

In this case, the human body is generally sensitive to an electric field but insensible to a magnetic field. Hence, if power is transferred using magnetic resonance, the bad influence on the human body due to the exposure to radiation may be reduced. Also, as the energy tail is generated in response to the resonance phenomenon, the form of power transmission may exhibit a non-radiative property. Consequently, upon transferring power using such electromagnetic wave, a radiative problem which occurs frequently may be solved.

The resonance coupling method may be a method for transferring power using the electromagnetic wave with the low frequency, as aforementioned. Thus, the transmitting coil 1111b of the wireless power transmitter 100 may form a magnetic field or electromagnetic wave for transferring power in principle. However, the resonance coupling method will be described hereinafter from the perspective of a magnetic resonance, namely, a power transmission by a magnetic field.

The resonant frequency may be determined by the following formula in Equation 1.

$$f = \frac{1}{2\pi\sqrt{LC}}$$ [Equation 1]

Here, the resonant frequency (f) is determined by an inductance (L) and a capacitance (C) in a circuit. In a circuit forming a magnetic field using a coil, the inductance can be determined by a number of turns of the coil, and the like, and the capacitance can be determined by a gap between the coils, an area, and the like. In addition to the coil, a capacitive resonant circuit may be configured to be connected thereto to determine the resonant frequency.

Referring to FIG. 6, when power is transmitted in a wireless manner according to the resonance coupling method, the power conversion unit 111 of the wireless power transmitter 100 may include a transmitting (Tx) coil 1111b in which a magnetic field is formed and a resonant circuit (or RESONANT GENERATION CIRCUIT) 1116 connected to the transmitting coil 1111b to determine a specific vibration frequency. The resonant circuit 1116 may be implemented by using a capacitive circuit (capacitors), and the specific vibration frequency may be determined based on an inductance of the transmitting coil 1111b and a capacitance of the resonant circuit 1116.

The configuration of a circuit element of the resonant circuit 1116 may be implemented in various forms such that the power conversion unit 111 forms a magnetic field, and is not limited to a form of being connected in parallel to the transmitting coil 1111b as illustrated in FIG. 6.

Furthermore, the power receiving unit 291 of the electronic device 200 may include a resonant circuit 2912 and a receiving (Rx) coil 2911b to generate a resonance phenomenon by a magnetic field formed in the wireless power transmitter 100. In other words, the resonant circuit 2912 may be also implemented by using a capacitive circuit, and the resonant circuit 2912 is configured such that a resonant frequency determined based on an inductance of the receiving coil 2911b and a capacitance of the resonant circuit 2912 has the same frequency as a resonant frequency of the formed magnetic field.

The configuration of a circuit element of the resonant circuit 2912 may be implemented in various forms such that the power receiving unit 291 generates resonance by a magnetic field, and is not limited to a form of being connected in series to the receiving coil 2911b as illustrated in FIG. 6.

The specific vibration frequency in the wireless power transmitter 100 may have LTx, CTx, and may be acquired by using the Equation 1. Here, the electronic device 200 generates resonance when a result of substituting the LRX and CRX of the electronic device 200 to the Equation 1 is same as the specific vibration frequency.

According to a contactless power transfer method by resonance coupling, when the wireless power transmitter 100 and electronic device 200 resonate at the same frequency, respectively, an electromagnetic wave is propagated through a short-range magnetic field, and thus there exists no energy transfer between the devices if they have different frequencies.

As a result, an efficiency of contactless power transfer by the resonance coupling method is greatly affected by a frequency characteristic, whereas the effect of an alignment and distance between the wireless power transmitter 100 and the electronic device 200 including each coil is relatively smaller than the inductive coupling method.

Hereinafter, the configuration of a wireless power transmitter and an electronic device in the resonance coupling method applicable to the embodiments disclosed herein will be described in detail.

FIG. 7 is a block diagram illustrating part of the wireless power transmitter 100 and the electronic device 200 in a resonance method that can be employed in the embodiments disclosed herein.

Figure 7A:
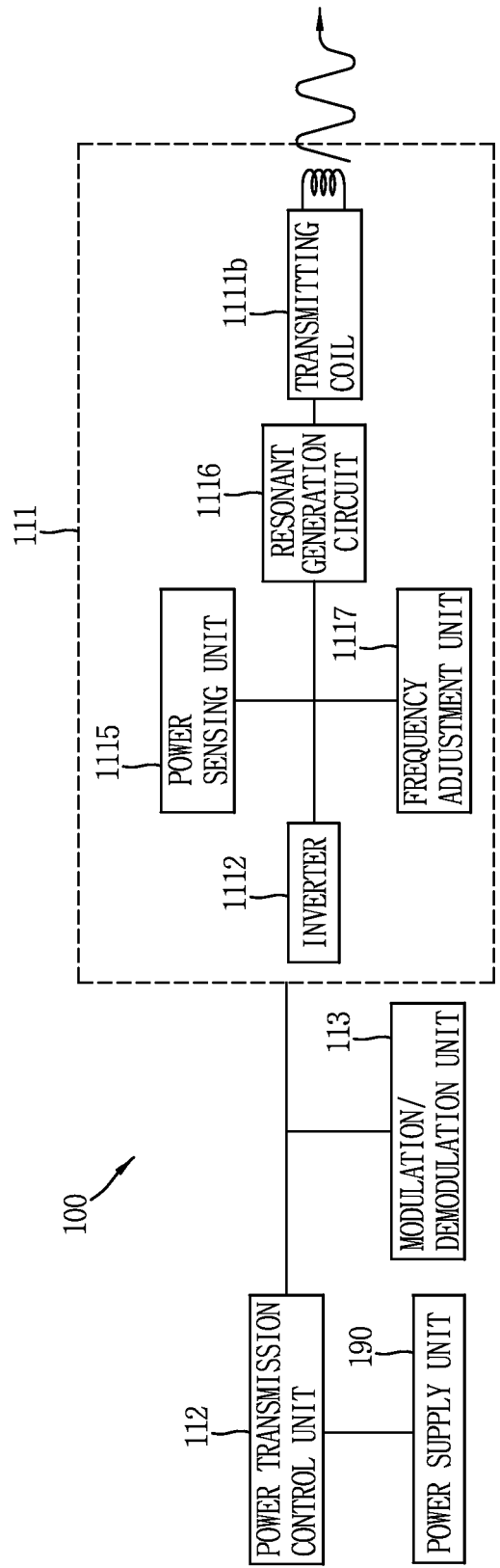
FIGS. 7A and 7B are block diagrams illustrating part of the wireless power transmitter 100 and the electronic device 200 in a resonance method that can be employed in the embodiments disclosed herein.

A configuration of the power transmission unit 110 included in the wireless power transmitter 100 will be described with reference to FIG. 7A.

The power conversion unit 111 of the wireless power transmitter 100 may include a transmitting (Tx) coil 1111b, an inverter 1112, and a resonant circuit 1116. The inverter 1112 may be configured to be connected to the transmitting coil 1111b and the resonant circuit 1116.

The transmitting coil 1111b may be mounted separately from the transmitting coil 1111a for transferring power according to the inductive coupling method, but may transfer power in the inductive coupling method and resonance coupling method using one single coil.

The transmitting coil 1111b, as described above, forms a magnetic field for transferring power. The transmitting coil 1111b and the resonant circuit 1116 generate resonance when alternating current power is applied thereto, and at this time, a vibration frequency may be determined based on an inductance of the transmitting coil 1111b and a capacitance of the resonant circuit 1116.

For this purpose, the inverter 1112 transforms a DC input obtained from the power supply unit 190 into an AC waveform, and the transformed AC current is applied to the transmitting coil 1111b and the resonant circuit 1116.

In addition, the power conversion unit 111 may further include a frequency adjustment unit 1117 for changing a resonant frequency of the power conversion unit 111. The resonant frequency of the power conversion unit 111 is determined based on an inductance and/or capacitance within a circuit constituting the power conversion unit 111 by Equation 1, and thus the power transmission control unit 112 may determine the resonant frequency of the power conversion unit 111 by controlling the frequency adjustment unit 1117 to change the inductance and/or capacitance.

The frequency adjustment unit 1117, for example, may be configured to include a motor for adjusting a distance between capacitors included in the resonant circuit 1116 to change a capacitance, or include a motor for adjusting a number of turns or diameter of the transmitting coil 1111b to change an inductance, or include active elements for determining the capacitance and/or inductance On the other hand, the power conversion unit 111 may further include a power sensing unit 1115. The operation of the power sensing unit 1115 is the same as the foregoing description.

Figure 7B:
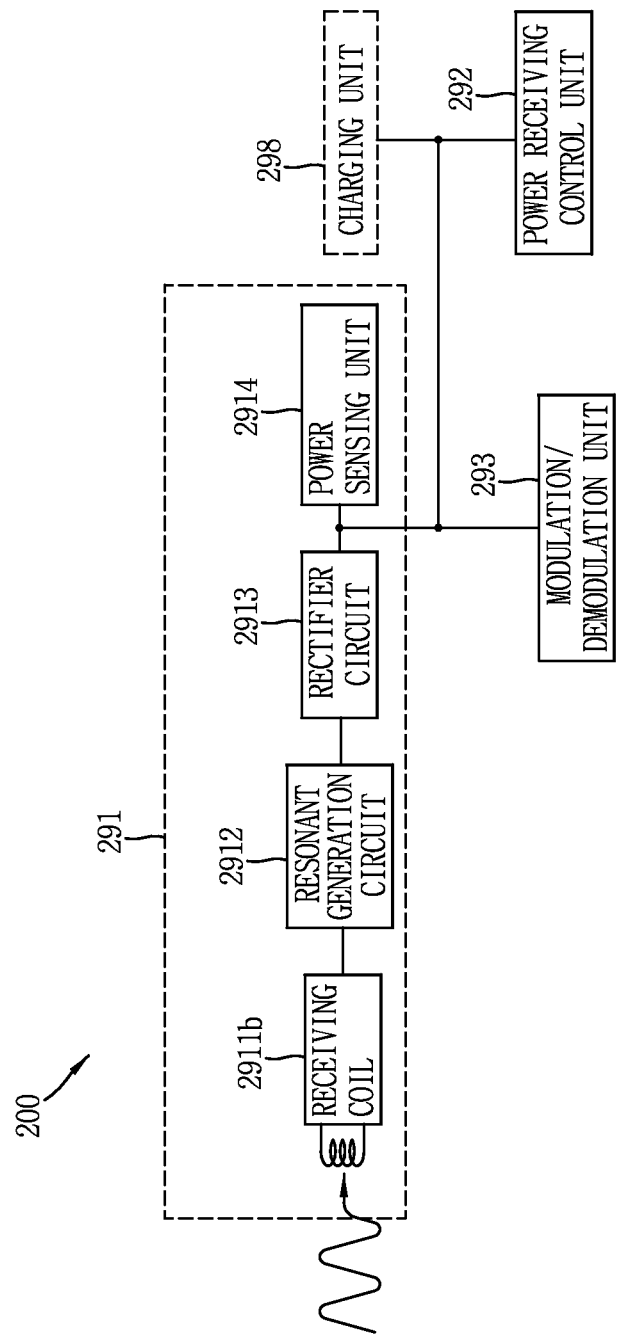

Referring to FIG. 7B, a configuration of the power supply unit 290 included in the electronic device 200 will be described. The power supply unit 290, as described above, may include a receiving (Rx) coil 2911b and a resonant circuit 2912.

In addition, the power receiving unit 291 of the power supply unit 290 may further include a rectifier generation circuit 2913 for converting an AC current generated by resonance phenomenon into DC. The rectifier generation circuit 2913 may be configured similarly to the foregoing description.

The power receiving unit 291 may further include a frequency adjustment unit 2917 for changing a resonant frequency of the power receiving unit 291. The resonant frequency of the power receiving unit 291 is determined based on an inductance and/or capacitance within a circuit constituting the power receiving unit 291 by Equation 1, and thus the power receiving control unit 112 may determine the resonant frequency of the power receiving unit 291 by controlling the frequency adjustment unit 2917 to change the inductance and/or capacitance.

The frequency adjustment unit 2917, for example, may be configured to include a motor for adjusting a distance between capacitors included in the resonant circuit 1116 to change a capacitance, or include a motor for adjusting a number of turns or a diameter of the transmitting coil 1111b to change an inductance, or include active elements for determining the capacitance and/or inductance.

Furthermore, the power receiving unit 291 may further include a power sensing unit 2914 for monitoring a voltage and/or current of the rectified power. The power sensing unit 2914 may be configured similarly to the foregoing description.

Figure 8:
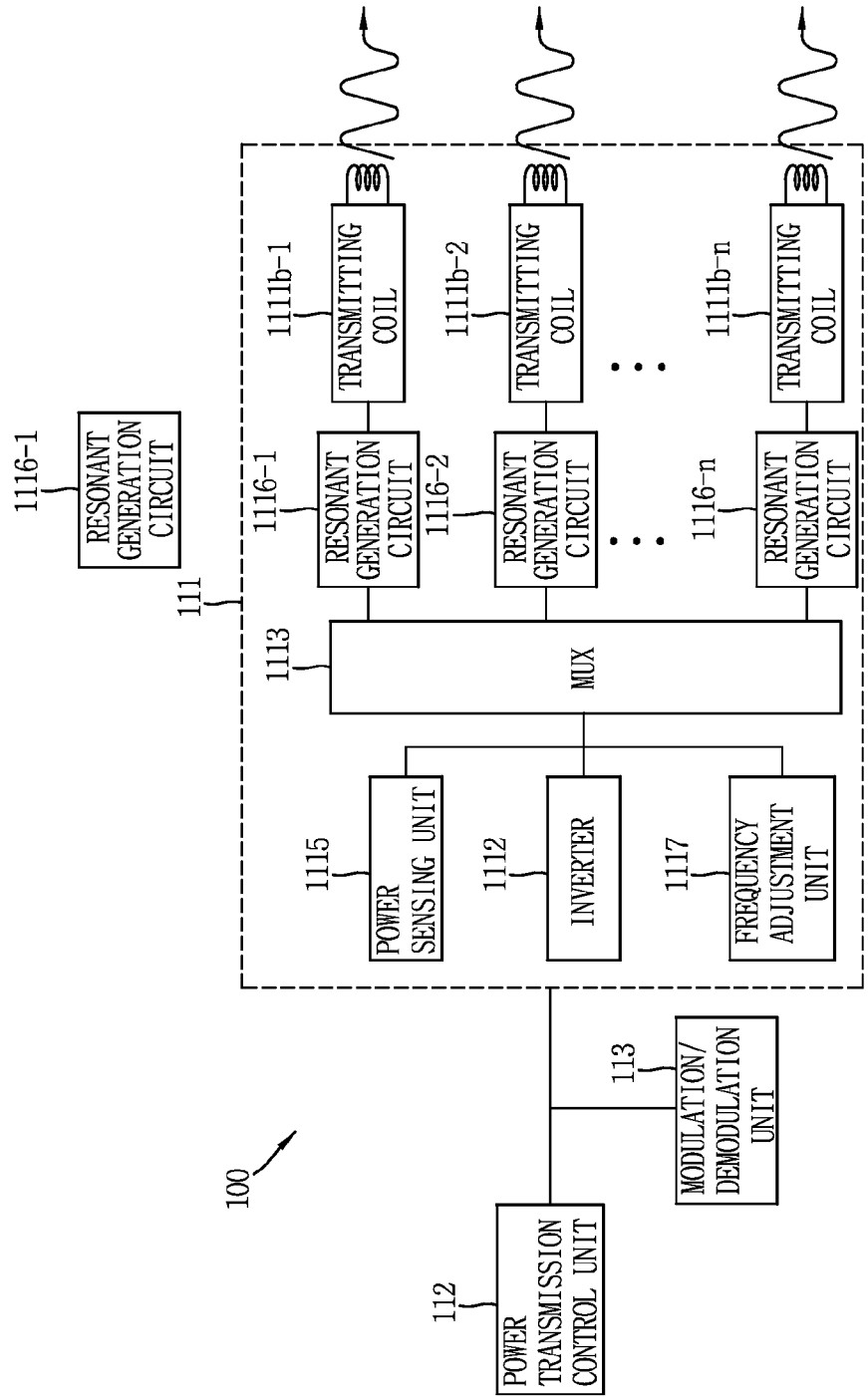
FIG. 8 is a block diagram illustrating a wireless power transmitter configured to have one or more transmitting coils receiving power according to a resonance coupling method that can be employed in the embodiments disclosed herein.

FIG. 8 is a block diagram illustrating a wireless power transmitter configured to have one or more transmission coils receiving power according to a resonance coupling method that can be employed in the embodiments disclosed herein.

Referring to FIG. 8, the power conversion unit 111 of the wireless power transmitter 100 according to the embodiments disclosed herein may include one or more transmitting coils 1111b-1 to 1111b-n and resonant circuits 1116-1 to 1116-n connected to each transmitting coils. Furthermore, the power conversion unit 111 may further include a multiplexer 1113 for establishing and releasing the connection of some of the one or more transmitting coils 1111b-1 to 1111b-n.

The one or more transmitting coils 1111b-1 to 1111b-n may be configured to have the same vibration frequency, or some of them may be configured to have different vibration frequencies. It is determined by an inductance and/or capacitance of the resonant circuits 1116-1 to 1116-n connected to the one or more transmitting coils 1111b-1 to 1111b-n, respectively.

In the meantime, when one or more electronic devices 200 are disposed in an active area or a detection area of the wireless power transmitter 100 including the one or more transmitting coils 1111b-1 to 1111b-n, the power transmission control unit 112 may control the multiplexer 1113 to allow the electronic devices to be placed in different resonance coupling relations. Accordingly, the wireless power transmitter 100 may wirelessly transfer power to the one or more electronic devices by generating the wireless power signal using different coils.

In addition, the power transmission control unit 112 may set power with a different characteristic to be supplied to each of the coils corresponding to the electronic devices. Here, the wireless power transmitter 100 may transfer power by differently setting a power transmission scheme, a resonant frequency, efficiency, a characteristic and the like for each electronic device. The power transmission for one or more electronic devices will be described later with reference to FIG. 28.

For this purpose, the frequency adjustment unit 1117 may be configured to change an inductance and/or capacitance of the resonant circuits 1116-1 to 1116-n connected to the one or more transmitting coils 1111b-1 to 1111b-n, respectively.

Hereinafter, an example of the wireless power transmitter implemented in the form of a wireless charger will be described.

Figure 9:
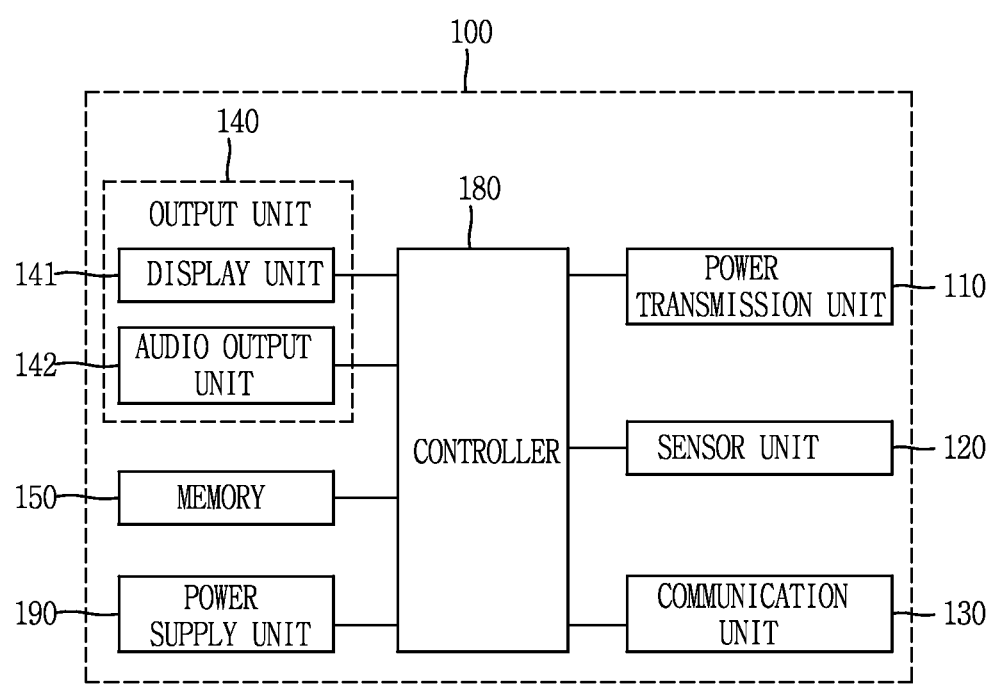
FIG. 9 is a block diagram illustrating a wireless power transmitter further comprising additional constituent elements in addition to those constituent elements illustrated in FIG. 2A.

FIG. 9 is a block diagram illustrating a wireless power transmitter further including an additional element in addition to the configuration illustrated in FIG. 2A.

Referring to FIG. 9, the wireless power transmitter 100 may further include a sensor unit 120, a communication unit 130, an output unit 140, a memory 150, and a control unit (or Controller) 180 in addition to the power transmission unit 110 and power supply unit 190 for supporting at least one of the foregoing inductive coupling method and resonance coupling method.

The controller 180 controls the power transmission unit 110, the sensor unit 120, the communication unit 130, the output unit 140, the memory 150, and the power supply unit 190.

The controller 180 may be implemented by a module separated from the power transmission control unit 112 in the power transmission unit 110 described with reference to FIG. 2 or may be implemented by a single module.

The sensor unit 120 may include a sensor for detecting the location of the electronic device 200. The location information detected by the sensor unit 120 may be used for allowing the power transmission unit 110 to transfer power in an efficient manner.

For instance, in case of wireless power transfer according to the inductive coupling method, the sensor unit 120 may be operated as a detection unit, and the location information detected by the sensor unit 120 may be used to move or rotate the transmitting coil 1111a in the power transmission unit 110.

Furthermore, for example, the wireless power transmitter 100 configured to include the foregoing one or more transmitting coils may determine coils that can be placed in an inductive coupling relation or resonance coupling relation to the receiving coil of the electronic device 200 among the one or more transmitting coils based on the location information of the electronic device 200.

On the other hand, the sensor unit 120 may be configured to monitor whether or not the electronic device 200 approaches a chargeable region. The approach or non-approach detection function of the sensor unit 120 may be carried out separately from the function of allowing the power transmission control unit 112 in the power transmission unit 110 to detect the approach or non-approach of the electronic device 200.

The communication unit 130 performs wired or wireless data communication with the electronic device 200. The communication unit 130 may include an electronic component for at least any one of Bluetooth™, Zigbee, Ultra Wide Band (UWB), Wireless USB, Near Field Communication (NFC), and Wireless LAN.

The output unit 140 may include at least one of a display unit 141 and an audio output unit (or SOUND OUTPUT UNIT) 142. The display unit 141 may include at least one of a liquid crystal display (LCD), a thin film transistor-liquid crystal display (TFT-LCD), an organic light-emitting diode (OLED), a flexible display, and a three-dimensional (3D)

display. The display unit 141 may display a charging state under the control of the controller 180.

The memory 150 may include at least one storage medium of a flash memory type, a hard disk type, a multimedia card micro type, a card type memory (e.g., SD or XD memory), a random access memory (RAM), a static random access memory (SRAM), a read-only memory (ROM), an electrically erasable programmable read-only memory (EEPROM), a programmable read-only memory (PROM), a magnetic memory, a magnetic disk, an optical disk, and the like. The wireless power transmitter 100 may operate in association with a web storage performing the storage function of the memory 150 on the Internet. A program or commands performing the foregoing functions of the wireless power transmitter 100 may be stored in the memory 150. The control unit (or Controller) 180 may perform the program or commands stored in the memory 150 to transmit power in a wireless manner. A memory controller (not shown) may be used to allow other constituent elements (e.g., controller 180) included in the wireless power transmitter 100 to access the memory 150.

However, it would be easily understood by those skilled in the art that the configuration of a wireless power transmitter according to the embodiment disclosed herein may be applicable to an apparatus, such as a docking station, a terminal cradle device, and an electronic device, and the like, excluding a case where it is applicable to only a wireless charger.

Figure 10:
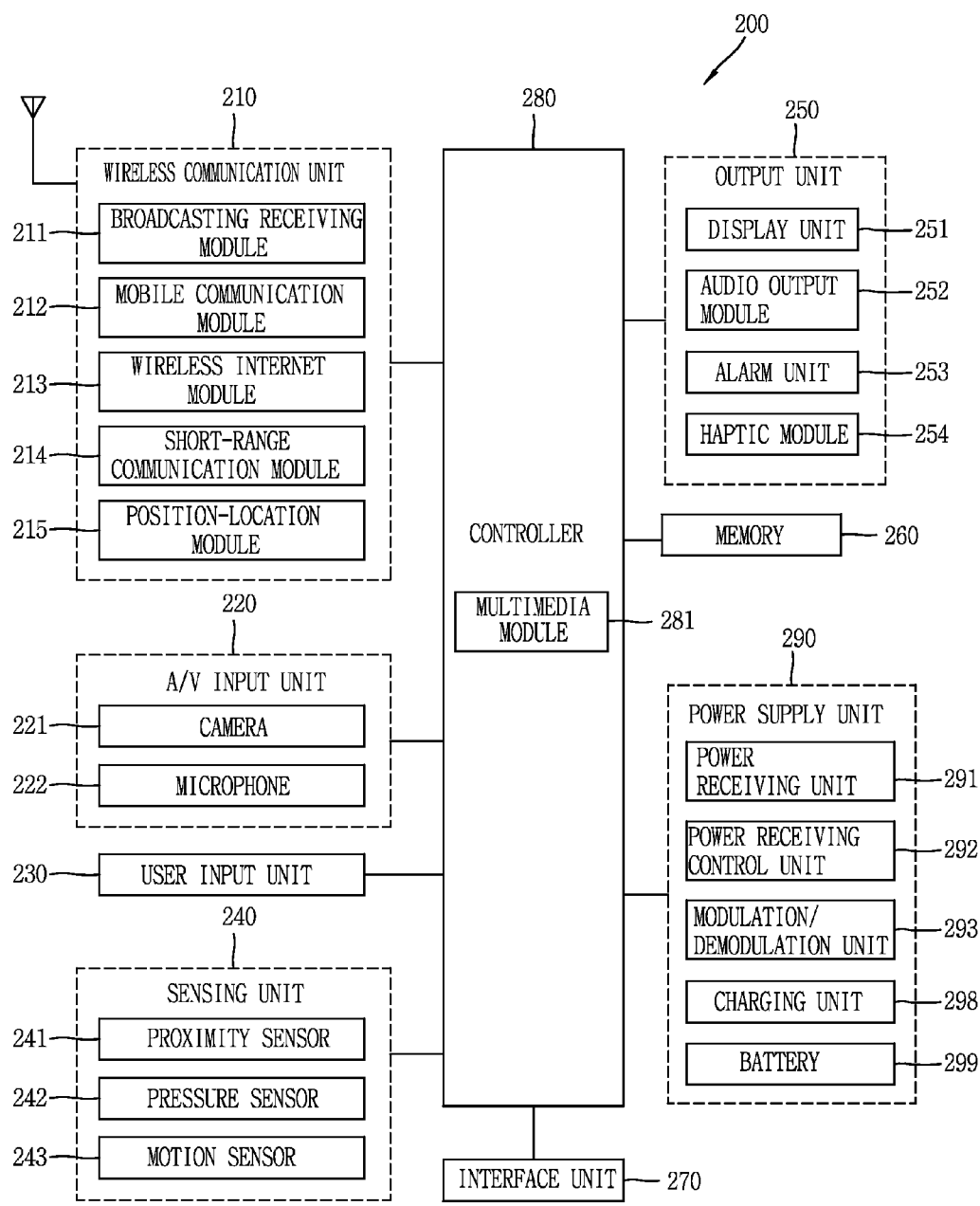
FIG. 10 is a configuration view illustrating a case where an electronic device 200 is implemented in a type of a mobile terminal in accordance with exemplary embodiments disclosed herein.

FIG. 10 is view illustrating a configuration in case where an electronic device 200 according to the embodiments disclosed herein is implemented in the form of a mobile terminal.

The mobile communication terminal 200 may include a power supply unit 290 illustrated in FIG. 2, 4, or 7.

Furthermore, the terminal 200 may further include a wireless communication unit 210, an Audio/Video (A/V) input unit 220, a user input unit 230, a sensing unit 240, an output unit 250, a memory 260, an interface unit 270, and a controller 280. FIG. 10 illustrates the terminal 100 having various components, but it is understood that implementing all of the illustrated components is not a requirement. Greater or fewer components may alternatively be implemented.

Hereinafter, each component is described in sequence.

The wireless communication unit 210 may typically include one or more modules which permit wireless communications between the terminal 200 and a wireless communication system or between the terminal 200 and a network within which the terminal 200 is located. For example, the wireless communication unit 210 may include a broadcast receiving module 211, a mobile communication module 212, a wireless internet module 213, a short-range communication module 214, a position location module 215 and the like.

The broadcast receiving module 211 receives a broadcast signal and/or broadcast associated information from an external broadcast managing entity via a broadcast channel.

The broadcast channel may include a satellite channel and a terrestrial channel. The broadcast center may indicate a server which generates and transmits a broadcast signal and/or broadcast associated information or a server which receives a pre-generated broadcast signal and/or broadcast associated information and sends them to the portable terminal. The broadcast signal may be implemented as a TV broadcast signal, a radio broadcast signal, and a data broadcast signal, among others. The broadcast signal may further include a data broadcast signal combined with a TV or radio broadcast signal.

Examples of broadcast associated information may denote information associated with a broadcast channel, a broadcast program, a broadcast service provider, and the like. The broadcast associated information may be provided via a mobile communication network. In this case, it may be received by the mobile communication module 212.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like.

The broadcast receiving module 211 may be configured to receive digital broadcast signals transmitted from various types of broadcast systems. Such broadcast systems may include Digital Multimedia Broadcasting-Terrestrial (DMB-T), Digital Multimedia Broadcasting-Satellite (DMB-S), Media Forward Link Only (MediaFLO), Digital Video Broadcast-Handheld (DVB-H), Integrated Services Digital Broadcast-Terrestrial (ISDB-T) and the like. The broadcast receiving module 211 may be configured to be suitable for every broadcast system transmitting broadcast signals as well as the digital broadcasting systems.

Broadcast signals and/or broadcast associated information received via the broadcast receiving module 211 may be stored in a suitable device, such as a memory 260.

The mobile communication module 212 transmits/receives wireless signals to/from at least any one of a base station, an external portable terminal, and a server on a mobile communication network. The wireless signal may include audio call signal, video (telephony) call signal, or various formats of data according to transmission/reception of text/multimedia messages.

The wireless internet module 213 supports wireless Internet access for the mobile terminal 200. This module may be internally or externally coupled to the terminal 100. Examples of such wireless Internet access may include Wireless LAN (WLAN) (Wi-Fi), Wireless Broadband (Wibro), Worldwide Interoperability for Microwave Access (Wimax), High Speed Downlink Packet Access (HSDPA) and the like.

The short-range communication module 214 denotes a module for short-range communications. Suitable technologies for implementing this module may include Bluetooth, Radio Frequency IDentification (RFID), Infrared Data Association (IrDA), Ultra-WideBand (UWB), ZigBee, and the like. On the other hand, Universal Serial Bus (USB), IEEE 1394, Thunderbolt of Intel technology, and the like, may be used for wired short-range communication.

The wireless internet module 213 or the short-range communication module 214 may establish data communication connection to the wireless power transmitter 100.

Through the established data communication, when there is an audio signal to be outputted while transferring power in a wireless manner, the wireless internet module 213 or the short-range communication module 214 may transmit the audio signal to the wireless power transmitter 100 through the short-range communication module. Furthermore, through the established data communication, when there is information to be displayed, the wireless internet module 213 or the short-range communication module 214 may transmit the information to the wireless power transmitter 100. Otherwise, the wireless internet module 213 or the short-range communication module 214 may transmit an audio signal received through a microphone integrated in the wireless power transmitter 100. Furthermore, the wireless internet module 213 or the short-range communication module 214 may transmit the identification information (e.g., phone number or device name in case of a portable phone) of the mobile terminal 200 to the wireless power transmitter 100 through the established data communication.

The position location module 215 is a module for acquiring a position of the terminal. An example of the position location module 215 may include a Global Position System (GPS) module.

Referring to FIG. 10, the A/V input unit 220 is configured to provide audio or video signal input to the portable terminal. The A/V input unit 220 may include a camera 221 and a microphone 222. The camera 221 processes image frames of still or moving images obtained by an image sensor in a video call mode or a capture more. The processed image frames may be displayed on the display unit 251.

The image frames processed by the camera 221 may be stored in the memory 260 or transmitted to the exterior via the wireless communication unit 210. Two or more cameras 221 may be provided therein according to the use environment.

The microphone 222 may receive an external audio signal by a microphone in a phone call mode, a recording mode, a voice recognition mode, or the like to process it into electrical audio data. The processed audio data is converted and outputted into a format transmittable to a mobile communication base station via the mobile communication module 212 in case of the phone call mode. The microphone 222 may include various noise removal algorithms to remove noises generated while receiving the external audio signal.

The user input unit 230 may generate input data to allow the user to control the operation of the terminal. The user input unit 230 may include a keypad, a dome switch, a touchpad (e.g., static pressure/capacitance), a jog wheel, a jog switch and the like.

The sensing unit 240 may include a proximity sensor 241, a pressure sensor 242, a motion sensor 243, and the like. The proximity sensor 241 detects an object approaching the mobile terminal 200, or the presence or absence of an object existing adjacent to the mobile terminal 200, and the like without any mechanical contact. The proximity sensor 241 may detect a proximity object using a change of the AC magnetic field or static magnetic field, a change rate of the electrostatic capacity, or the like. Two or more proximity sensors 241 may be provided according to the aspect of configuration.

The pressure sensor 242 may detect whether or not a pressure is applied to the mobile terminal 200, a size of the pressure, and the like. The pressure sensor 242 may be provided at a portion where the detection of a pressure is required in the mobile terminal 200 according to the use environment. When the pressure sensor 242 is provided in the display unit 251, it may be possible to identify a touch input through the display unit 251 and a pressure touch input by which a pressure larger than the touch input is applied according to a signal outputted from the pressure sensor 242. Furthermore, it may be possible to know a size (strength) of the pressure applied to the display unit 251 during the input of a pressure touch.

The motion sensor 243 detects the location or movement of the mobile terminal 200 using an acceleration sensor, a gyro sensor, and the like. The acceleration sensor used in the motion sensor 243 is an element for converting an acceleration change in any one direction into an electrical signal. Two or three axes are typically integrated into a package to constitute an acceleration sensor, and only one Z-axis may be required according to the use environment. Accordingly, when an acceleration sensor in the direction of X-axis or Y-axis should be used instead of the direction of Z-axis due to any reason, the acceleration sensor may be erected and mounted on a main substrate using a separate piece substrate. Furthermore, the gyro sensor is a sensor for measuring an angular speed of the mobile terminal 200 in a rotational movement to detect a rotated angle with respect to each reference direction. For instance, the gyro sensor may detect each rotational angle, i.e., azimuth, pitch and roll, with reference to three directional axes.

The output unit 250 is provided to output visual, auditory, or tactile information. The output unit 250 may include a display unit 251, an audio output module 252, an alarm unit 253, a haptic module 254, and the like.

The display unit 251 may display (output) information processed in the terminal 200. For example, when the terminal is in a phone call mode, the display unit 251 will provide a User Interface (UI) or Graphic User Interface (GUI) associated with the call. When the terminal is in a video call mode or a capture mode, the display unit 251 may display images captured and/or received, UI, or GUI.

The display unit 251 may include at least one of a liquid crystal display (LCD), a thin film transistor-liquid crystal display (TFT-LCD), an organic light-emitting diode (OLED), a flexible display, a three-dimensional (3D) display, and the like.

Some of those displays may be configured as a transparent type or an light transmission type through which the outside is visible, which is referred to as a transparent display. A representative example of the transparent display may include a Transparent OLED (TOLED), or the like. The rear surface of the display unit 151 may also be implemented to be optically transparent. Under this configuration, the user can view an object positioned at a rear side of the terminal body through a region occupied by the display unit 251 of the terminal body.

The display unit 251 may be implemented in two or more in number according to a configured aspect of the terminal 200. For instance, a plurality of the display units 251 may be arranged on one surface to be spaced apart from or integrated with each other, or may be arranged on different surfaces.

Here, if the display unit 251 and a touch sensitive sensor (referred to as a touch sensor) have a layered structure therebetween, the display unit 251 may be used as an input device rather than an output device. The touch sensor may be implemented as a touch film, a touch sheet, a touch pad, and the like.

The touch sensor may be configured to convert changes of a pressure applied to a specific part of the display unit 251, or a capacitance occurring from a specific part of the display unit 251, into electric input signals. Also, the touch sensor may be configured to sense not only a touched position and a touched area, but also touch pressure.

When touch inputs are sensed by the touch sensors, corresponding signals are sent to a touch controller. The touch controller processes the received signals, and then transmits corresponding data to the controller 280. Accordingly, the controller 280 may sense which region of the display unit 151 has been touched.

The proximity sensor 241 may be arranged at an inner region of the terminal covered by the touch screen, or near the touch screen. The proximity sensor refers to a sensor to sense the presence or absence of an object approaching a surface to be sensed, or an object disposed near a surface to be sensed, using an electromagnetic field or infrared rays without a mechanical contact. The proximity sensor has a longer lifespan and a more enhanced utility than a contact sensor.

The proximity sensor may include a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and so on. When the touch screen is implemented as a capacitance type, proximity of a pointer to the touch screen is sensed by changes of an electromagnetic field. In this case, the touch screen (touch sensor) may be categorized into a proximity sensor.

Hereinafter, for the sake of brief explanation, a status that the pointer is positioned to be proximate onto the touch screen without contact will be referred to as a "proximity touch", whereas a status that the pointer substantially comes in contact with the touch screen will be referred to as a "contact touch". For the position corresponding to the proximity touch of the pointer on the touch screen, such position corresponds to a position where the pointer faces perpendicular to the touch screen upon the proximity touch of the pointer.

The proximity sensor senses proximity touch, and proximity touch patterns (e.g., distance, direction, speed, time, position, moving status, etc.). Information relating to the sensed proximity touch and the sensed proximity touch patterns may be output onto the touch screen.

The audio output module 252 may output audio data received from the wireless communication unit 210 or stored in the memory 260, in a call-receiving mode, a call-placing mode, a recording mode, a voice recognition mode, a broadcast reception mode, and so on. The audio output module 252 may output audio signals relating to functions performed in the terminal 200, e.g., sound alarming a call received or a message received, and so on. The audio output module 252 may include a receiver, a speaker, a buzzer, and so on.

The alarm 253 outputs signals notifying the occurrence of an event from the terminal 200. The event occurring from the terminal 100 may include call received, message received, key signal input, touch input, and so on. The alarm 253 may output not only video or audio signals, but also other types of signals such as signals notifying occurrence of events in a vibration manner. Since the video or audio signals can be output through the display unit 251 or the audio output unit 252, the display unit 251 and the audio output module 252 may be categorized into part of the alarm 253.

The haptic module 254 generates various tactile effects which a user can feel. A representative example of the tactile effects generated by the haptic module 254 includes vibration. Vibration generated by the haptic module 254 may have a controllable intensity, a controllable pattern, and so on. For instance, different vibration may be output in a synthesized manner or in a sequential manner.

The haptic module 254 may generate various tactile effects, including not only vibration, but also arrangement of pins vertically moving with respect to a skin being contacted, air injection force or air suction force through an injection hole or a suction hole, touch by a skin surface, presence or absence of contact with an electrode, effects by stimulus such as an electrostatic force, reproduction of cold or hot feeling using a heat absorbing device or a heat emitting device, and the like.

The haptic module 254 may be configured to transmit tactile effects through the user's direct contact, or the user's muscular sense using a finger or a hand. The haptic module 254 may be implemented in two or more in number according to the configuration of the terminal 200.

The memory 260 may store a program for the processing and control of the controller 280. Alternatively, the memory 260 may temporarily store input/output data (e.g., phonebook data, messages, still images, video and the like). Also, the memory 260 may store data related to various patterns of vibrations and audio output upon the touch input on the touch screen.

In some embodiments, software components including an operating system (not shown), a module performing a wireless communication unit 210 function, a module operating together with the user input unit 230, a module operating together with the A/V input unit 220, a module operating together with the output unit 250 may be stored in the memory 260. The operating system (e.g., LINUX, UNIX, OS X, WINDOWS, Chrome, Symbian, iOS, Android, VxWorks, or other embedded operating systems) may include various software components and/or drivers to control system tasks such as memory management, power management, and the like.

In addition, the memory 260 may store a setup program associated with contactless power transfer or wireless charging. The setup program may be implemented by the controller 280.

Furthermore, the memory 260 may store an application associated with contactless power transfer (or wireless charging) downloaded from an application providing server (for example, an app store). The wireless charging related application is a program for controlling wireless charging transmission, and thus the electronic device 200 may receive power from the wireless power transmitter 100 in a wireless manner or establish connection for data communication with the wireless power transmitter 100 through the relevant program.

The memory 260 may be implemented using any type of suitable storage medium including a flash memory type, a hard disk type, a multimedia card micro type, a memory card type (e.g., SD or xD memory), a random access memory (RAM), a static random access memory (SRAM), a read-only memory (ROM), an electrically erasable programmable read-only memory (EEPROM), a programmable read-only memory (PROM), a magnetic memory, a magnetic disk, an optical disk, and the like. Also, the terminal 200 may be operated in association with a web storage performing the storage function of the memory 160 on the Internet.

The interface unit 270 may generally be implemented to interface the portable terminal with all external devices. The interface unit 270 may allow a data reception from an external device, a power delivery to each component in the terminal 200, or a data transmission from the terminal 200 to an external device. The interface unit 270 may include, for example, wired/wireless headset ports, external charger ports, wired/wireless data ports, memory card ports, ports for coupling devices having an identification module, audio input/output (I/O) ports, video input/output (I/O) ports, earphone ports, and the like.

The identification module may be configured as a chip for storing various information required to authenticate an authority to use the terminal 200, which may include a User Identity Module (UIM), a Subscriber Identity Module (SIM), and the like. Also, the device having the identification module (hereinafter, referred to as "identification device") may be implemented in a type of smart card. Hence, the identification device can be coupled to the terminal 200 via a port.

Also, the interface unit may serve as a path for power to be supplied from an external cradle to the terminal 200 when the terminal 100 is connected to the external cradle or as a path for transferring various command signals inputted from the cradle by a user to the terminal 200. Such various command signals or power inputted from the cradle may operate as signals for recognizing that the terminal 200 has accurately been mounted to the cradle.

The controller 280 typically controls the overall operations of the terminal 200. For example, the controller 280 performs the control and processing associated with telephony calls, data communications, video calls, and the like. The controller 280 may include a multimedia module 281 for multimedia playback. The multimedia module 281 may be implemented within the controller 280, or implemented separately from the controller 280. Also, the controller 280 may be implemented into a separate module from the power receiving control unit 292 within the power supply unit 290 or a single module.

The controller 280 can perform a pattern recognition processing so as to recognize a writing input or image drawing input carried out on the touch screen as a text or image.

The controller 280 performs wired or wireless charging according to the user input or internal input. Here, the internal input represents a signal for notifying that an induced current generated from a secondary coil within the terminal has been detected.

When the aforementioned wireless charging is carried out, an operation of allowing the controller 280 to control each constituent element will be described in detail below with reference to the operation phase in FIG. 14. As described above, the power receiving control unit 292 within the power supply unit 290 may be implemented to be included in the controller 280, and in the present disclosure, it should be understood that the controller 280 performs the operation by the power receiving control unit 292.

The power supply unit 290 receives internal and external power under the control of the controller 280 to supply power required for the operation of each constituent element.

The power supply unit 290 is provided with a battery 299 for supplying power to each constituent element of the terminal 200, and the battery 299 may include a charger 298 for performing wired or wireless charging.

The present disclosure discloses a mobile terminal as an example of the apparatus for receiving power in a wireless manner, but it would be easily understood by those skilled in the art that the configuration according to the embodiment disclosed herein may be applicable to a stationary terminal, such as a digital TV, a desktop computer, and the like, excluding a case where it is applicable to only the mobile terminal.

FIG. 11 is a view illustrating the concept of transmitting and receiving a packet between a wireless power transmitter and an electronic device through the modulation and demodulation of a wireless power signal in transferring power in a wireless manner disclosed herein.

Figure 11A:
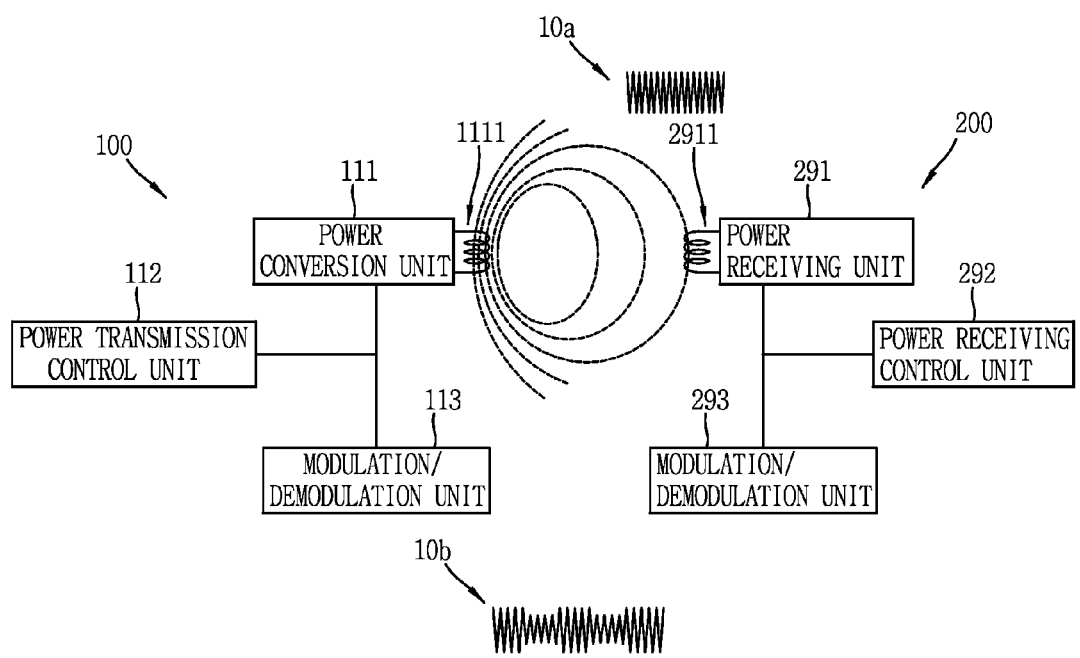
FIGS. 11A and 11B are views illustrating the concept of transmitting and receiving a packet between a wireless power transmitter and an electronic device through the modulation and demodulation of a wireless power signal in transferring power in a wireless manner disclosed herein.

Referring to FIG. 11A, the wireless power signal formed by the power conversion unit 111 forms a closed-loop within a magnetic field or electromagnetic field, and therefore, when the electronic device 200 modulates the wireless power signal while receiving the wireless power signal, the wireless power transmitter 100 may detect the modulated wireless power signal. The power communications modulation/demodulation unit 113 may demodulate the detected wireless power signal, and decodes the packet from the modulated wireless power signal.

On the other hand, a modulation method used for communication between the wireless power transmitter 100 and the electronic device 200 may be amplitude modulation. As described above, the amplitude modulation method may be a backscatter modulation method in which the modulation/demodulation unit 293 at the side of the electronic device 200 changes an amplitude of the wireless power signal 10*a* formed by the power conversion unit 111 and the modulation/demodulation unit 293 at the side of the wireless power transmitter 100 detects an amplitude of the modulated wireless power signal 10*b*.

Figure 11B:
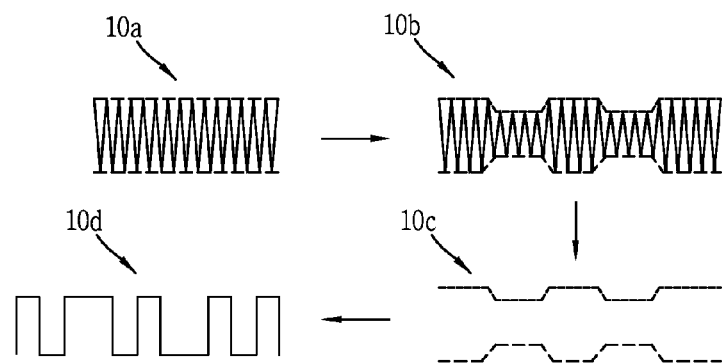

Specifically, further referring to FIG. 11B, the power receiving control unit 292 at the side of the electronic device 200 modulates the wireless power signal 10*a* received through the power receiving unit 291 by changing a load impedance within the modulation/demodulation unit 293. power receiving control unit 292 modulates the wireless power signal 10*a* to include a packet including a power control message to be transmitted to the wireless power transmitter 100.

Then, the power transmission control unit 112 at the side of the wireless power transmitter 100 demodulates the modulated wireless power signal 10*b* through an envelope detection process, and decodes the detected signal 10*c* into digital data 10*d*. The demodulation process detects a current or voltage flowing into the power conversion unit 111 to be classified into two states, a HI phase and a LO phase, and acquires a packet to be transmitted by the electronic device 200 based on digital data classified according to the states.

Hereinafter, a process of allowing the wireless power transmitter 100 to acquire a power control message to be transmitted by the electronic device 200 from the demodulated digital data will be described.

FIG. 12 is a view illustrating a method of showing data bits and byte constituting a power control message provided by the wireless power transmitter 100.

Figure 12A:
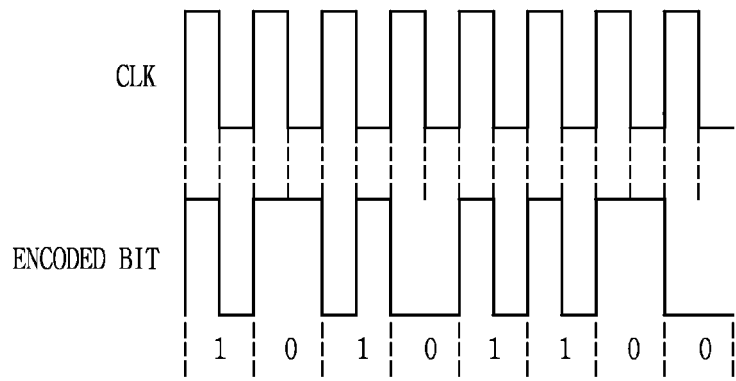
FIGS. 12A and 12B are views illustrating a method of showing data bits and byte constituting a power control message provided by the wireless power transmitter 100.

Referring to FIG. 12A, the power transmission control unit 112 detects an encoded bit using a clock signal (CLK) from an envelope detected signal. The detected encoded bit is encoded according to a bit encoding method used in the modulation process at the side of the electronic device 200. The bit encoding method may correspond to any one of non-return to zero (NRZ) and bi-phase encoding.

For instance, the detected bit may be a differential bi-phase (DBP) encoded bit. According to the DBP encoding, the power receiving control unit 292 at the side of the electronic device 200 is allowed to have two state transitions to encode data bit 1, and to have one state transition to encode data bit 0. In other words, data bit 1 may be encoded in such a manner that a transition between the HI state and LO state is generated at a rising edge and falling edge of the clock signal, and data bit 0 may be encoded in such a manner that a transition between the HI state and LO state is generated at a rising edge of the clock signal.

Figure 12B:
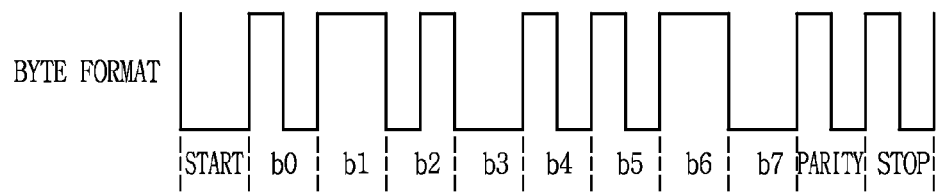

On the other hand, the power transmission control unit 112 may acquire data in a byte unit using a byte format constituting a packet from a bit string detected according to the bit encoding method. For instance, the detected bit string may be transferred by using an 11-bit asynchronous serial format as illustrated in FIG. 12B. In other words, the detected bit may include a start bit indicating the beginning of a byte and a stop bit indicating the end of a byte, and also include data bits (b0 to b7) between the start bit and the stop bit. Furthermore, it may further include a parity bit for checking an error of data. The data in a byte unit constitutes a packet including a power control message.

Figure 13:
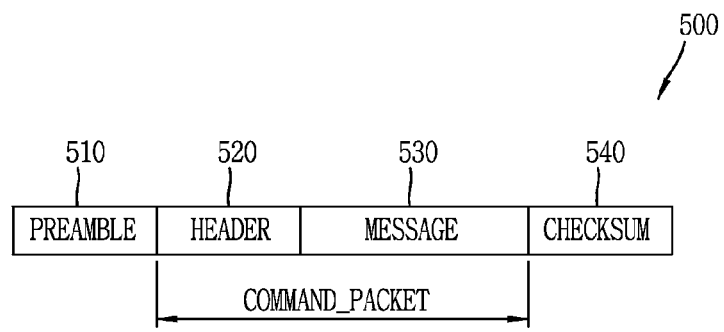
FIG. 13 is a view illustrating a packet including a power control message used in a contactless (wireless) power transfer method according to the embodiments disclosed herein.

FIG. 13 is a view illustrating a packet including a power control message used in a contactless power transfer method according to the embodiments disclosed herein.

The packet 500 may include a preamble 510, a header 520, a message 530, and a checksum 540.

The preamble 510 may be used to perform synchronization with data received by the wireless power transmitter 100 and detect the start bit of the header 520. The preamble 510 may be configured to repeat the same bit. For instance, the preamble 510 may be configured such that data bit 1 according to the DBP encoding is repeated eleven to twenty five times.

The header 520 may be used to indicate a type of the packet 500. A size of the message 530 and the kind thereof may be determined based on a value indicated by the header 520. The header 520 is a value having a predetermined size to be positioned subsequent to the preamble 510. For instance, the header 520 may be a byte in size.

The message 530 may be configured to include data determined based on the header 520. The message 530 has a predetermined size according to the kind thereof.

The checksum 540 may be used to detect an error that can be occurred in the header 520 and the message 530 while transmitting a power control message. The header 520 and the message 530 excluding the preamble 510 for synchronization and the checksum 540 for error checking may be referred to as command-packet.

Hereinafter, description will be given of operation phases of the wireless power transmitter 100 and the electronic device 200.

Figure 14:
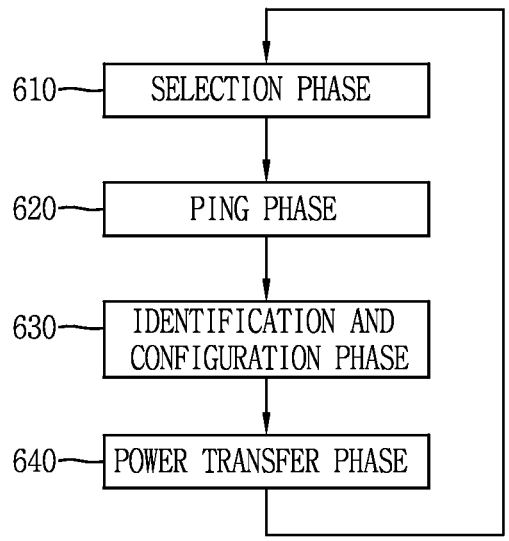
FIG. 14 is a view illustrating the operation phases of a wireless power transmitter 100 and an electronic device 200 according to the embodiments disclosed herein.

FIG. 14 illustrates the operation phases of the wireless power transmitter 100 and electronic device 200 according to the embodiments disclosed herein. Furthermore, FIGS. 15 through 20 illustrates the structure of packets including a power control message between the wireless power transmitter 100 and electronic device 200.

Referring to FIG. 14, the operation phases of the wireless power transmitter 100 and the electronic device 200 for wireless power transfer may be divided into a selection phase (state) 610, a ping phase 620, an identification and configuration phase 630, and a power transfer phase 640.

The wireless power transmitter 100 detects whether or not objects exist within a range that the wireless power transmitter 100 can transmit power in a wireless manner in the selection phase 610, and the wireless power transmitter 100 sends a detection signal to the detected object and the electronic device 200 sends a response to the detection signal in the ping phase 620.

Furthermore, the wireless power transmitter 100 identifies the electronic device 200 selected through the previous phases and acquires configuration information for power transmission in the identification and configuration phase 630. The wireless power transmitter 100 transmits power to the electronic device 200 while controlling power transmitted in response to a control message received from the electronic device 200 in the power transfer phase 640.

Hereinafter, each of the operation phases will be described in detail.

1) Selection Phase

The wireless power transmitter 100 in the selection phase 610 performs a detection process to select the electronic device 200 existing within a detection area. The detection area, as described above, refers to a region in which an object within the relevant area can affect on the characteristic of the power of the power conversion unit 111. Compared to the ping phase 620, the detection process for selecting the electronic device 200 in the selection phase 610 is a process of detecting a change of the power amount for forming a wireless power signal in the power conversion unit at the side of the wireless power transmitter 100 to check whether any object exists within a predetermined range, instead of the scheme of receiving a response from the electronic device 200 using a power control message. The detection process in the selection phase 610 may be referred to as an analog ping process in the aspect of detecting an object using a wireless power signal without using a packet in a digital format in the ping phase 620 which will be described later.

The wireless power transmitter 100 in the selection phase 610 can detect that an object comes in or out within the detection area. Furthermore, the wireless power transmitter 100 can distinguish the electronic device 200 capable of transferring power in a wireless manner from other objects (for example, a key, a coin, etc.) among objects located within the detection area.

As described above, a distance that can transmit power in a wireless manner may be different according to the inductive coupling method and resonance coupling method, and thus the detection area for detecting an object in the selection phase 610 may be different from one another.

First, in case where power is transmitted according to the inductive coupling method, the wireless power transmitter 100 in the selection phase 610 can monitor an interface surface (not shown) to detect the alignment and removal of objects.

Furthermore, the wireless power transmitter 100 may detect the location of the electronic device 200 placed on an upper portion of the interface surface. As described above, the wireless power transmitter 100 formed to include one or more transmitting coils may perform the process of entering the ping phase 620 in the selection phase 610, and checking whether or not a response to the detection signal is transmitted from the object using each coil in the ping phase 620 or subsequently entering the identification phase 630 to check whether identification information is transmitted from the object. The wireless power transmitter 100 may determine a coil to be used for contactless power transfer based on the detected location of the electronic device 200 acquired through the foregoing process.

Furthermore, when power is transmitted according to the resonance coupling method, the wireless power transmitter 100 in the selection phase 610 can detect an object by detecting that any one of a frequency, a current and a voltage of the power conversion unit is changed due to an object located within the detection area.

On the other hand, the wireless power transmitter 100 in the selection phase 610 may detect an object by at least any one of the detection methods using the inductive coupling method and resonance coupling method. The wireless power transmitter 100 may perform an object detection process according to each power transmission method, and subsequently select a method of detecting the object from the coupling methods for contactless power transfer to advance to other phases 620, 630, 640.

On the other hand, for the wireless power transmitter 100, a wireless power signal formed to detect an object in the selection phase 610 and a wireless power signal formed to perform digital detection, identification, configuration and power transmission in the subsequent phases 620, 630, 640 may have a different characteristic in the frequency, strength, and the like. It is because the selection phase 610 of the wireless power transmitter 100 corresponds to an idle phase for detecting an object, thereby allowing the wireless power transmitter 100 to reduce consumption power in the idle phase or generate a specialized signal for effectively detecting an object.

2) Ping Phase

The wireless power transmitter 100 in the ping phase 620 performs a process of detecting the electronic device 200 existing within the detection area through a power control message. Compared to the detection process of the electronic device 200 using a characteristic of the wireless power signal and the like in the selection phase 610, the detection process in the ping phase 620 may be referred to as a digital ping process.

The wireless power transmitter 100 in the ping phase 620 forms a wireless power signal to detect the electronic device 200, modulates the wireless power signal modulated by the electronic device 200, and acquires a power control message in a digital data format corresponding to a response to the detection signal from the modulated wireless power signal. The wireless power transmitter 100 may receive a power control message corresponding to the response to the detection signal to recognize the electronic device 200 which is a subject of power transmission.

The detection signal formed to allowing the wireless power transmitter 100 in the ping phase 620 to perform a digital detection process may be a wireless power signal formed by applying a power signal at a specific operating point for a predetermined period of time. The operating point may denote a frequency, duty cycle, and amplitude of the voltage applied to the transmitting (Tx) coil. The wireless power transmitter 100 may generate the detection signal generated by applying the power signal at a specific operating point for a predetermined period of time, and attempt to receive a power control message from the electronic device 200.

Figure 15:
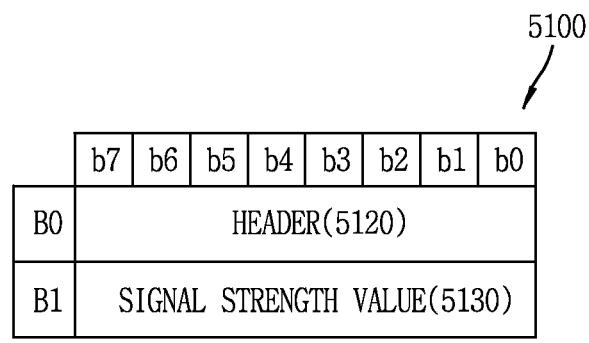

On the other hand, the power control message corresponding to a response to the detection signal may be a message indicating a strength of the wireless power signal received by the electronic device 200. For example, the electronic device 200 may transmit a signal strength packet 5100 including a message indicating the received strength of the wireless power signal as a response to the detection signal as illustrated in FIG. 15. The packet 5100 may include a header 5120 for notifying a packet indicating the signal strength and a message 5130 indicating a strength of the power signal received by the electronic device 200. The strength of the power signal within the message 5130 may be a value indicating a degree of inductive coupling or resonance coupling for power transmission between the wireless power transmitter 100 and the electronic device 200.

The wireless power transmitter 100 may receive a response message to the detection signal to find the electronic device 200, and then extend the digital detection process to enter the identification and configuration phase 630. In other words, the wireless power transmitter 100 maintains the power signal at a specific operating point subsequent to finding the electronic device 200 to receive a power control message required in the identification and configuration phase 630.

However, if the wireless power transmitter 100 is not able to find the electronic device 200 to which power can be transferred, then the operation phase of the wireless power transmitter 100 will be returned to the selection phase 610.

3) Identification and Configuration Phase

The wireless power transmitter 100 in the identification and configuration phase 630 may receive identification information and/or configuration information transmitted by the electronic device 200, thereby controlling power transmission to be effectively carried out.

Figure 16A:
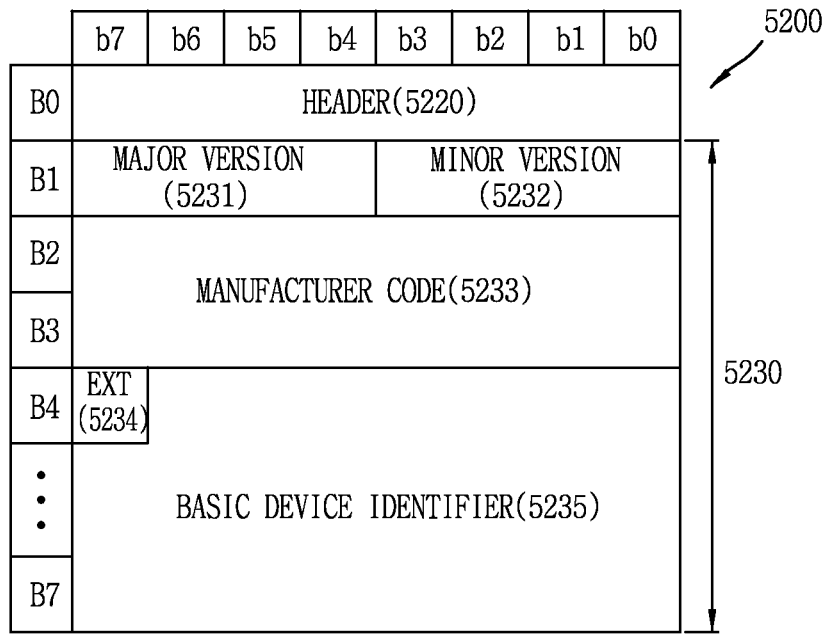
Figure 16B:
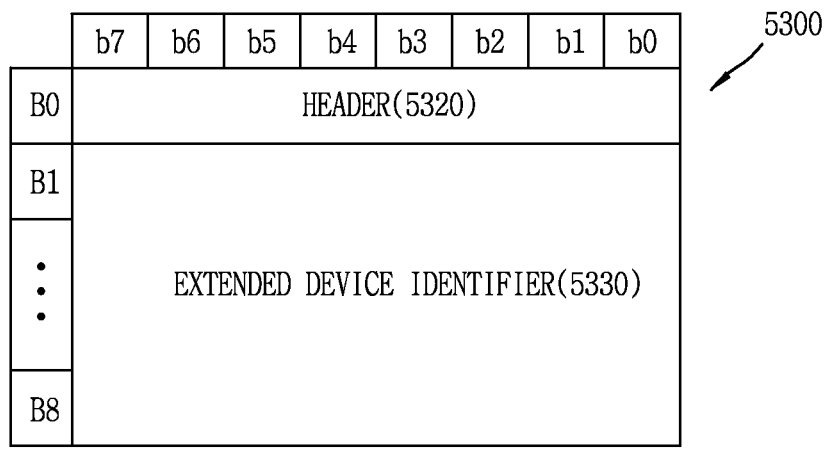

The electronic device 200 in the identification and configuration phase 630 may transmit a power control message including its own identification information. For this purpose, the electronic device 200, for instance, may transmit an identification packet 5200 including a message indicating the identification information of the electronic device 200 as illustrated in FIG. 16A. The packet 5200 may include a header 5220 for notifying a packet indicating identification information and a message 5230 including the identification information of the electronic device. The message 5230 may include information (5231 and 5232) indicating a version of the contract for contactless power transfer, information 5233 for identifying a manufacturer of the electronic device 200, information 5234 indicating the presence or absence of an extended device identifier, and a basic device identifier 5235. Furthermore, if it is displayed that an extended device identifier exists in the information 5234 indicating the presence or absence of an extended device identifier, then an extended identification packet 5300 including the extended device identifier as illustrated in FIG. 16B will be transmitted in a separate manner. The packet 5300 may include a header 5320 for notifying a packet indicating an extended device identifier and a message 5330 including the extended device identifier. When the extended device identifier is used as described above, information based on the manufacturer's identification information 5233, the basic device identifier 5235 and the extended device identifier 5330 will be used to identify the electronic device 200.

Figure 17:
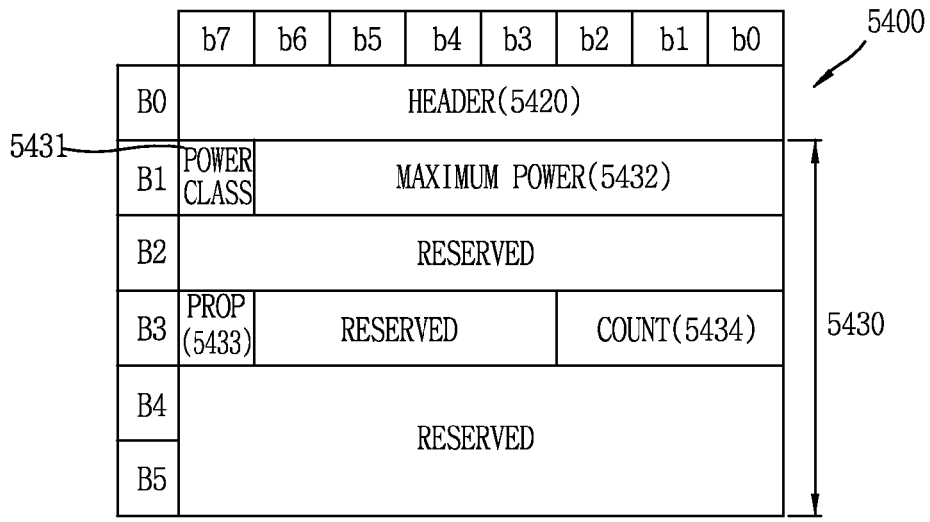

The electronic device 200 may transmit a power control message including information on expected maximum power in the identification and configuration phase 630. To this end, the electronic device 200, for instance, may transmit a configuration packet 5400 as illustrated in FIG. 17. The packet may include a header 5420 for notifying that it is a configuration packet and a message 5430 including information on the expected maximum power. The message 5430 may include power class 5431, information 5432 on expected maximum power, an indicator 5433 indicating a method of determining a current of a main cell at the side of the wireless power transmitter, and the number 5434 of optional configuration packets. The indicator 5433 may indicate whether or not a current of the main cell at the side of the wireless power transmitter is determined as specified in the contract for wireless power transfer.

Meanwhile, the electronic device 200 according to the exemplary embodiments may transmit a power control message, which includes required power information thereof and associated profile information, to the wireless power transmitter 100. In some exemplary embodiments, the required power information related to the electronic device 200 or the profile information may be transmitted by being included in the configuration packet 5400 as illustrated in FIG. 17. Alternatively, the required power information related to the electronic device 200 or the profile information may be transmitted by being included in a separate packet for configuration.

On the other hand, the wireless power transmitter 100 may generate a power transfer contract which is used for power charging with the electronic device 200 based on the identification information and/or configuration information.

The power transfer contract may include the limits of parameters determining a power transfer characteristic in the power transfer phase 640.

The wireless power transmitter 100 may terminate the identification and configuration phase 630 and return to the selection phase 610 prior to entering the power transfer phase 640. For instance, the wireless power transmitter 100 may terminate the identification and configuration phase 630 to find another electronic device that can receive power in a wireless manner.

4) Power Transfer Phase

The wireless power transmitter 100 in the power transfer phase 640 transmits power to the electronic device 200.

Figure 18:
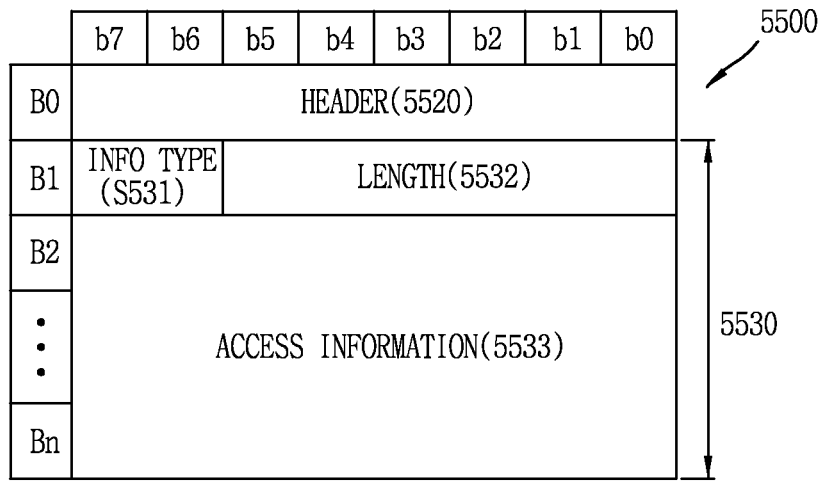

The wireless power transmitter 100 may receive a power control message from the electronic device 200 while transferring power, and control a characteristic of the power applied to the transmitting coil in response to the received power control message. For example, the power control message used to control a characteristic of the power applied to the transmitting coil may be included in a control error packet 5500 as illustrated in FIG. 18. The packet 5500 may include a header 5520 for notifying that it is a control error packet and a message 5530 including a control error value. The wireless power transmitter 100 may control the power applied to the transmitting coil according to the control error value. In other words, a current applied to the transmitting coil may be controlled so as to be maintained if the control error value is "0", reduced if the control error value is a negative value, and increased if the control error value is a positive value.

The wireless power transmitter 100 may monitor parameters within a power transfer contract generated based on the identification information and/or configuration information in the power transfer phase 640. As a result of monitoring the parameters, if power transmission to the electronic device 200 violates the limits included in the power transfer contract, then the wireless power transmitter 100 may cancel the power transmission and return to the selection phase 610.

The wireless power transmitter 100 may terminate the power transfer phase 640 based on a power control message transferred from the electronic device 200.

For example, if the charging of a battery has been completed while charging the battery using power transferred by the electronic device 200, then a power control message for requesting the suspension of wireless power transfer will be transferred to the wireless power transmitter 100. In this case, the wireless power transmitter 100 may receive a message for requesting the suspension of the power transmission, and then terminate wireless power transfer, and return to the selection phase 610.

For another example, the electronic device 200 may transfer a power control message for requesting renegotiation or reconfiguration to update the previously generated power transfer contract. The electronic device 200 may transfer a message for requesting the renegotiation of the power transfer contract when it is required a larger or smaller amount of power than the currently transmitted power amount. In this case, the wireless power transmitter 100 may receive a message for requesting the renegotiation of the power transfer contract, and then terminate contactless power transfer, and return to the identification and configuration phase 630.

Figure 19:
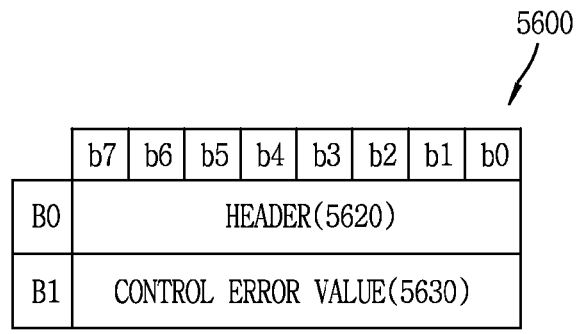

To this end, a message transmitted by the electronic device 200, for instance, may be an end power transfer packet 5600 as illustrated in FIG. 19. The packet 5600 may include a header 5620 for notifying that it is an end power transfer packet and a message 5630 including an end power transfer code indicating the cause of the suspension. The end power transfer code may indicate any one of charge complete, internal fault, over temperature, over voltage, over current, battery failure, reconfigure, no response, and unknown error.

Hereinafter, description will be given of a method for allowing a wireless power transmitter to set a frequency for wireless power transfer, with reference to FIGS. 20 to 32.

Frequency Split Between Transmitting Coil and Receiving Coil

Figure 20:
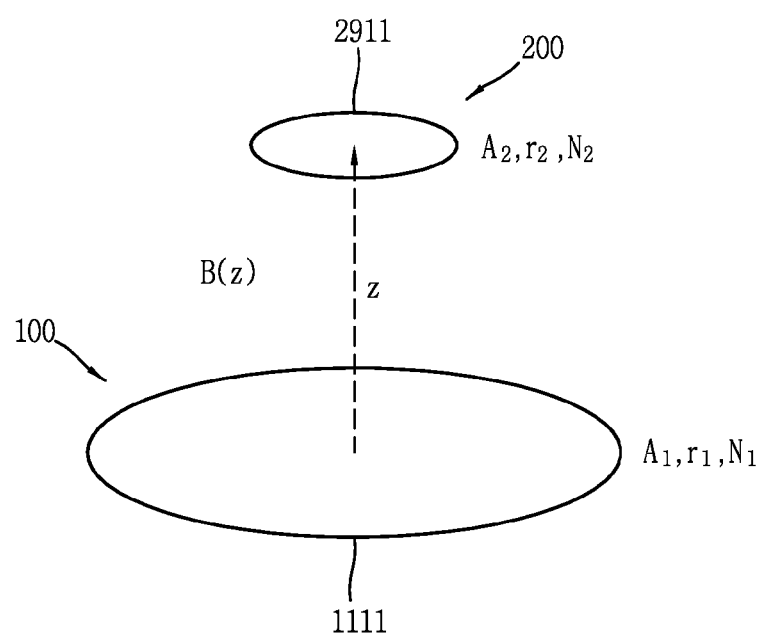
FIGS. 20 and 21 are views illustrating a frequency split phenomenon which occurs between a transmitting coil of a wireless power transmitter and a receiving coil of a wireless power receiver.
Figure 21:
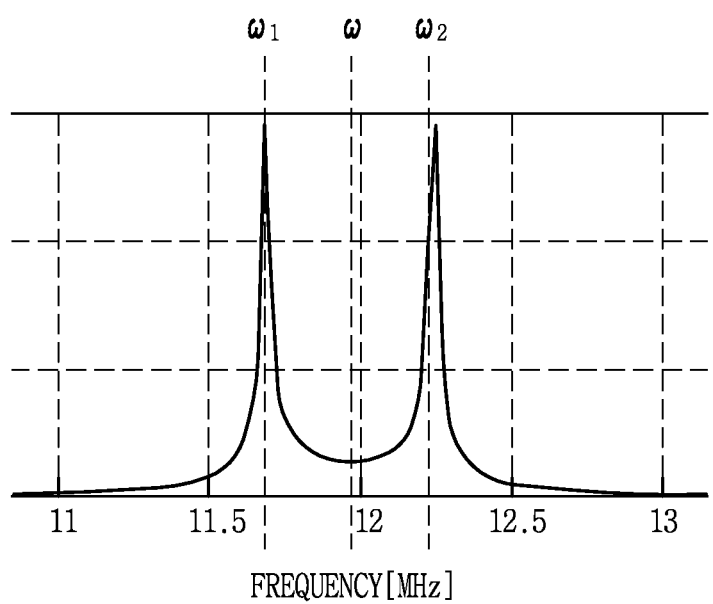

FIGS. 20 and 21 are views illustrating a frequency split phenomenon which occurs between a transmitting coil of a wireless power transmitter and a receiving coil of a wireless power receiver.

As illustrated in FIG. 20, a wireless power signal may be formed between a transmitting coil 1111 within the wireless power transmitter 100 and a receiving coil 2911. A physical characteristic of the wireless power signal formed between the transmitting coil 1111 and the receiving coil 2911 may differ according to a wireless power transfer method between the coils.

For example, when power is transferred in response to a formation of a wireless power signal according to a resonance coupling between the transmitting coil 1111 and the receiving coil 2911, the wireless power signal may be a magnetic field signal, formed based on an area A1 formed by the transmitting coil 1111, a radius r1 of the transmitting coil 1111, a number of turns N1 of the transmitting coil 1111, an area A2 formed by the receiving coil 2911, a radius r2 of the receiving coil 2911, the number of turns N2 of the receiving coil 2911, and a distance z between the transmitting coil 1111 and the receiving coil 2911.

In general, when power is transferred by a magnetic field which is formed between the transmitting coil 1111 and the receiving coil 2911, high power transmission gain (or high power transmission margin) may be exhibited near a resonant frequency of the magnetic field.

Here, it may be possible to observe a frequency split characteristic having a plurality of peaks near the resonant frequency according to a distance between the transmitting coil 1111 and the receiving coil 2911, a magnetic characteristic of the wireless power receiver, or the number of wireless power receivers.

Specifically, in the wireless power transfer between the transmitting coil 1111 and the receiving coil 2911, a transmission gain curve may show the frequency split characteristic having peaks formed at a first frequency w1 and a second frequency w2 which are present near a resonant frequency w. The frequency split characteristic may be expressed by the following equation which shows the first frequency w1 and the second frequency w2.

$$\omega_{1,2} = \omega \pm \sqrt{k^2 - \Gamma^2} \quad \text{[Equation 2]}$$

where k denotes a coupling coefficient between the two coils, and Γ denotes a coefficient indicating a degree of dissipation due to a medium between the two coils. The coupling coefficient from Equation 2 may be expressed by the following Equation 3.

$$\omega_2 - \omega_1 = \Delta\omega = 2\sqrt{k^2 - \Gamma^2} \Rightarrow k = \sqrt{\left(\frac{\Delta\omega}{2}\right)^2 + \Gamma^2} \quad \text{[Equation 3]}$$

Also, those Equations may be approximated as expressed by the following Equation 4.

$$\omega_2 - \omega \approx k, \quad k = \frac{2k}{\omega} = \frac{M}{\sqrt{L_1 L_2}} \approx \frac{\Delta\omega}{\omega} = \frac{\omega_2 - \omega_1}{\omega} \quad \text{[Equation 4]}$$

As illustrated in FIG. 21, when the frequency split characteristic is exhibited, the peaks may be generated at the first frequency w1 and the second frequency w2, other than near the resonant frequency w. Accordingly, a frequency with the maximum transmission efficiency may be changed and also a receiving element at the frequency with the peak may be damaged.

Hereinafter, description will be given of a frequency setting method and apparatus for a wireless power transmitter for improving power transmission efficiency or stability, taking into account a frequency split characteristic and the like between the transmitting coil 1111 and the receiving coil 2911 in accordance with exemplary embodiments disclosed herein.

Description of Wireless Power Transmitter Having Frequency Setting Function

A wireless power transmitter having a frequency setting function according to exemplary embodiments disclosed herein may include a power transfer unit (or wireless power transfer unit) that transmits a wireless power signal and acquires power transmission information from a wireless power receiver which receives the wireless power signal, and a controller that controls the power transfer unit to decide a transmittable frequency band for the wireless power signal based on the power transmission information, set a specific frequency within the decided frequency band as a transmission frequency of the wireless power signal, and transmit the wireless power signal corresponding to the set transmission frequency to the wireless power receiver.

In accordance with the exemplary embodiments, the power transfer unit (or wireless power transfer unit) may transmit wireless power signals with different frequencies in a sequential manner, and acquire power transmission information corresponding to each of the sequentially-transmitted wireless power signals.

Figure 22:
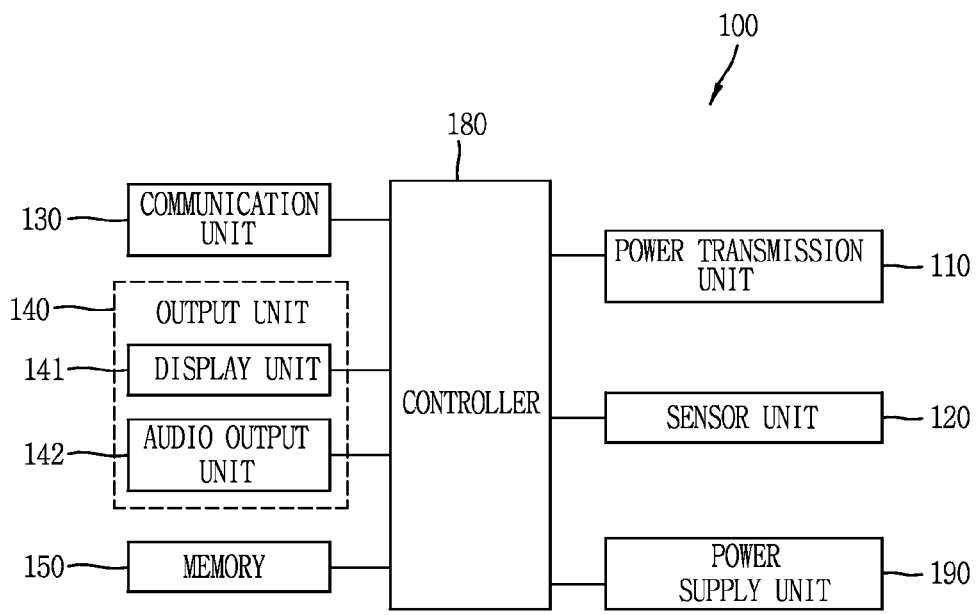
FIG. 22 is a block diagram illustrating a configuration of a wireless power transmitter for setting a frequency in accordance with exemplary embodiments disclosed herein.

FIG. 22 is a block diagram illustrating a configuration of a wireless power transmitter for setting a frequency in accordance with exemplary embodiments disclosed herein.

Also, FIG. 22 is a block diagram illustrating a wireless power transmitter further comprising additional constituent elements in addition to those illustrated in FIG. 2A.

As illustrated in FIG. 22, the wireless power transmitter 100 may include a power transfer unit (or wireless power transfer unit) 110 that supports at least one of the aforementioned inductive coupling method and the resonance coupling method, and a controller 180.

The wireless power transmitter 100 may also further include a power supply unit 190, a sensor unit 120, a communication unit 130, an output unit 140, and a memory 150, in order to execute a function of setting a transmission frequency of a wireless power signal.

Besides, the wireless power transmitter 100 may further include various constituent elements for executing the frequency setting function.

Hereinafter, each of those constituent elements will be described in sequence.

The power transfer unit 110 may transmit a wireless power signal, and acquire power transmission information from a wireless power receiver 200 which receives the wireless power signal.

The power transfer unit 110 may acquire the power transmission information by various methods.

For example, the power transfer unit 110 may transmit wireless power signals with different frequencies in a sequential manner, and acquire power transmission information corresponding to each of the sequentially-transmitted wireless power signals. This method may be referred to as frequency scanning.

The frequency scanning may allow for detecting a relationship between the frequency of the wireless power signal and the power transmission information, and setting a transmission frequency of the wireless power signal based on the detected relationship.

For example, the power transmission information may include information related to at least one of a receiving side voltage of the wireless power receiver 200, a receiving side current of the wireless power receiver, a first reference voltage and a second reference voltage.

The receiving side voltage and the receiving side current may refer to a voltage and a current existing within the wireless power receiver 200. For example, the receiving side voltage and the receiving side current may be an output voltage and an output current of the receiving coil 2911.

In accordance with one exemplary embodiment disclosed herein, the first reference voltage and the second reference voltage may be voltage information related to a receiving side (or receiving end) voltage of the wireless power receiver 200.

Also, in accordance with one exemplary embodiment, the first reference voltage may be decided based on whether it is a voltage which is likely to cause damage on the wireless power receiver, and the second reference voltage may be decided based on whether it is a voltage by which the wireless power receiver can receive power from the wireless power transmitter in a wireless manner.

For example, when the receiving side voltage of the wireless power receiver 200 is likely to cause damage on the wireless power receiver 200 at a value over 100V, the first reference voltage may be 100V. That is, the first reference voltage may be a minimum receiving side voltage by which the damage is caused.

Also, in case where the wireless power receiver 200 is unable to normally receive power in a wireless manner when the receiving side voltage is less than 10V, the second reference voltage may be 10V. That is, the second reference voltage may be a minimum receiving side voltage which allows for a normal operation of the wireless power receiver 200.

The controller 180 may execute various functions for carrying out the function of setting the transmission frequency of the wireless power signal.

For example, the controller 180 may control the power transfer unit 110, the sensor unit 120, the communication unit 130, the output unit 140, the memory 150, and the power supply unit 190, in order to carry out the setting function of the transmission frequency of the wireless power signal.

The controller 180 may be implemented in various forms. For example, the controller 180 may be implemented as a separate module from the power transmission control unit 112 within the power transfer unit 110, which has been described with reference to FIG. 2, or a single module.

In accordance with exemplary embodiments disclosed herein, the controller 180 may decide a transmittable (or selectable) frequency band for the wireless power signal based on the power transmission information.

The controller 180 may also set a specific frequency belonging to the decided frequency band as the transmission frequency of the wireless power signal.

The controller may control the power transfer unit 110 to transmit the wireless power signal corresponding to the set transmission frequency to the wireless power receiver.

The sensor unit 120 may include a sensor that senses (detects) a location of the wireless power receiver 200. The location information detected by sensor unit 120 may be used such that the power conversion unit 110 can efficiently transfer power.

For example, for a wireless power transfer according to embodiments supporting an inductive coupling method, the sensor unit 120 may operate as a detection unit, and the location information sensed by the sensor unit 120 may be used to move or rotate the transmitting coil 1111a within the power conversion unit 110.

For example, the wireless power transmitter 100 according to the exemplary embodiments illustrating the configuration including one or more transmitting coils may decide coils which have an inductive coupling relationship or a resonance coupling relation with the receiving coil of the wireless power receiver 200, among the one or more transmitting coils, based on the location information of the wireless power receiver 200.

The sensor unit 120 may monitor whether or not the wireless power receiver 200 approaches a rechargeable region. The approach or non-approach sensing function of the sensor unit 120 may be executed separately from or in combination with a function that the power transmission control unit 112 of the power transfer unit 110 senses the approach or non-approach of the wireless power receiver 200.

The communication unit 130 may execute wired/wireless data communications with the wireless power receiver 200. The communication unit 130 may include an electronic component for at least one of Bluetooth™, Zigbee, ultra wide band (UWB), wireless USB, near field communication (NFC), and wireless LAN.

The output unit 140 may include at least one of a display module 141 and an audio output module 142. The display module 141 may include at least one of a liquid crystal display (LCD), a thin film transistor-LCD (TFT LCD), an organic light-emitting diode (OLED), a flexible display, and a 3D display. The display module 141 may output a charging state according to the control of the controller 180.

The memory 150 may include at least one storage medium of a flash memory type, a hard disk type, a multimedia card micro type, a card type memory (e.g., SD or XD memory), a random access memory (RAM), a static random access memory (SRAM), a read-only memory (ROM), an electrically erasable programmable read-only memory (EEPROM), a programmable read-only memory (PROM), a magnetic memory, a magnetic disk, an optical disk, and the like. The wireless power transmitter 100 may operate in association with a web storage performing the storage function of the memory 150 on the Internet. A program or commands performing the foregoing functions of the wireless power transmitter 100 may be stored in the memory 150. The control unit (or Controller) 180 may perform the program or commands stored in the memory 150 to transmit power in a wireless manner. A memory controller (not shown) may be used to allow other constituent elements (e.g., controller 180) included in the wireless power transmitter 100 to access the memory 150.

Meanwhile, the wireless power transmitter 100 setting the frequency according to the exemplary embodiments disclosed herein may also be implemented as the type of the wireless power transmitter illustrated in FIG. 2A.

In detail, the power conversion unit 111 may execute frequency scanning (indicating the aforementioned method) within a predetermined frequency range, acquire power transmission information by the wireless power receiver 200 within a predetermined region with respect to the scanned frequencies, and transmit power in a wireless manner according to a set operating frequency (or transmission frequency).

The power transmission control unit 112 may determine whether or not to acquire the power transmission information. That is, the power transmission information may be acquired in such cases, for example, when at least one of the receiving side voltage, transmission efficiency and transmission gain (or transmission margin) is below a reference value, when a new wireless power receiver is arranged within a specific region, when the number of wireless power receivers within the specific region changes, when at least one wireless receiver within the specific region changes in location, when the acquisition is carried out in a periodical manner, or when there is a request received from the wireless power receiver.

For example, the power transmission control unit 112 may determine whether or not to acquire power transmission information, by determining whether transmission efficiency of transmitted power is less than a predetermined value, whether a control message for requesting for the change in frequency setting has been received, or whether a predetermined time has elapsed in case where the power transmission information is periodically acquired.

Here, the specific region may refer to a region through which the wireless power signal passes, or a region where the wireless power receiver 200 is detected (or, the active region or detection region).

The transmission efficiency is a ratio between transmitted power (or transmission power) of the wireless power transmitter and received power (or reception power) of the wireless power receiver, and the transmission gain is a ratio between a transmitting side voltage of the wireless power transmitter and the receiving side voltage. Here, the received power may be detected based on the receiving side voltage information and the receiving side current information.

The power transmission control unit 112 may set a transmission frequency (or operating frequency) for transmitting power in a wireless manner through the power conversion unit 111 based on the power transmission information.

Also, the power transmission control unit 112 may detect presence or absence of the wireless power receiver 200 within the predetermined region using the wireless power signal formed by the power conversion unit 111. Or, the power transmission control unit 112 may detect presence or absence of the wireless power receiver 200 by a separate detecting unit (not illustrated).

Frequency Setting Method for Wireless Power Signal According to Exemplary Embodiments A method for setting a frequency of a wireless power signal according to exemplary embodiments may include acquiring power transmission information from a wireless power receiver which receives the wireless power signal, and setting a transmission frequency of the wireless power signal based on the acquired power transmission information.

Also, the setting of the transmission frequency may include deciding a transmittable frequency band for the wireless power signal based on the power transmission information, and setting a specific frequency belonging to the decided frequency band as the transmission frequency of the wireless power signal.

In accordance with one exemplary embodiment, the frequency setting method for the wireless power signal may further include storing the decided frequency band.

Figure 23:
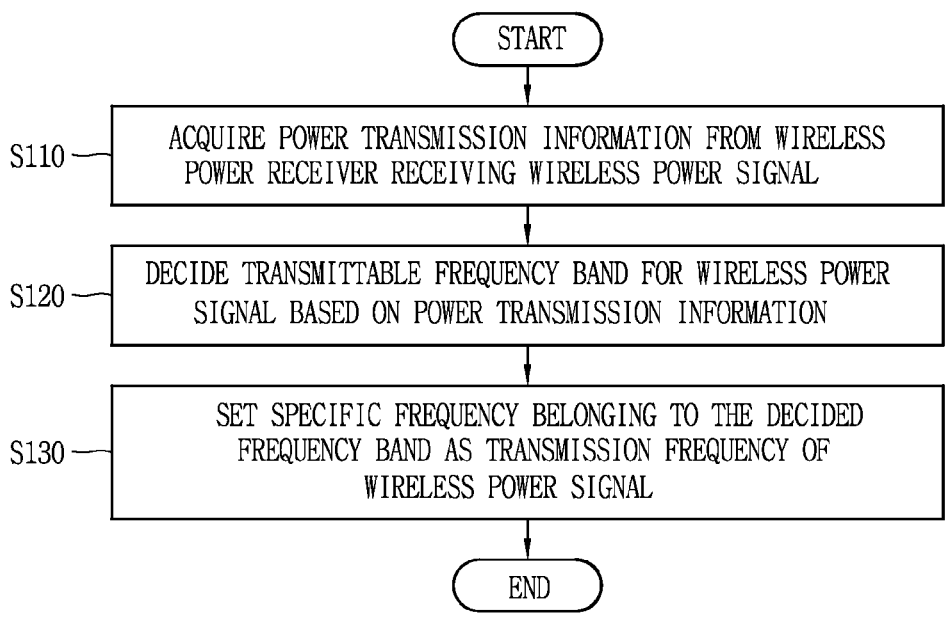
FIG. 23 is a flowchart illustrating a frequency setting method of a wireless power signal in accordance with exemplary embodiments disclosed herein.

FIG. 23 is a flowchart illustrating a method for setting a frequency of a wireless power signal in accordance with exemplary embodiments disclosed herein.

As illustrated in FIG. 23, a method for setting a frequency of a wireless power signal according to exemplary embodiments disclosed herein may include the following steps.

First, the wireless power transmitter 100 may acquire power transmission information from a wireless power receiver which receives a wireless power signal (S110).

The wireless power transmitter 100 may decide a transmittable frequency band for the wireless power signal based on the power transmission information (S120).

The wireless power transmitter 100 may then set a specific frequency belonging to the decided frequency band as a transmission frequency of the wireless power signal (S130).

As aforementioned, the power transmission information may include information related to at least one of a receiving side voltage of the wireless power receiver, a receiving side current of the wireless power receiver, a first reference voltage and a second reference voltage.

Also, the first reference voltage may be decided based on whether it is a voltage which is likely to cause damage on the wireless power receiver, and the second reference voltage may be decided based on whether it is a voltage by which the wireless power receiver can receive power from the wireless power transmitter in a wireless manner.

The specific frequency may be selected (or decided) according to various references (basis, conditions). For example, the specific frequency may be decided such that at least one of the received side voltage, transmission efficiency and transmission gain can be maximized.

First Embodiment—Frequency Scanning

A first exemplary embodiment disclosed herein may be implemented by part or combination of components or steps included in the aforementioned embodiments or by combination of those embodiments. Hereinafter, repetitive parts will be omitted to clearly express the first exemplary embodiment disclosed herein.

A method for setting a frequency of a wireless power signal in accordance with a first exemplary embodiment disclosed herein may include acquiring power transmission information from a wireless power receiver which receives the wireless power signal, and setting a transmission frequency of the wireless power signal based on the acquired power transmission information.

In accordance with the first exemplary embodiment, the setting of the transmission frequency may include deciding a transmittable frequency band for the wireless power signal based on the power transmission information, and setting a specific frequency belonging to the decided frequency band as the transmission frequency of the wireless power signal.

Also, in accordance with the first exemplary embodiment, the acquiring of the power transmission information may include transmitting wireless power signals having different frequencies in a sequential manner, and acquiring power transmission information corresponding to each of the sequentially-transmitted wireless power signals.

Figure 24:
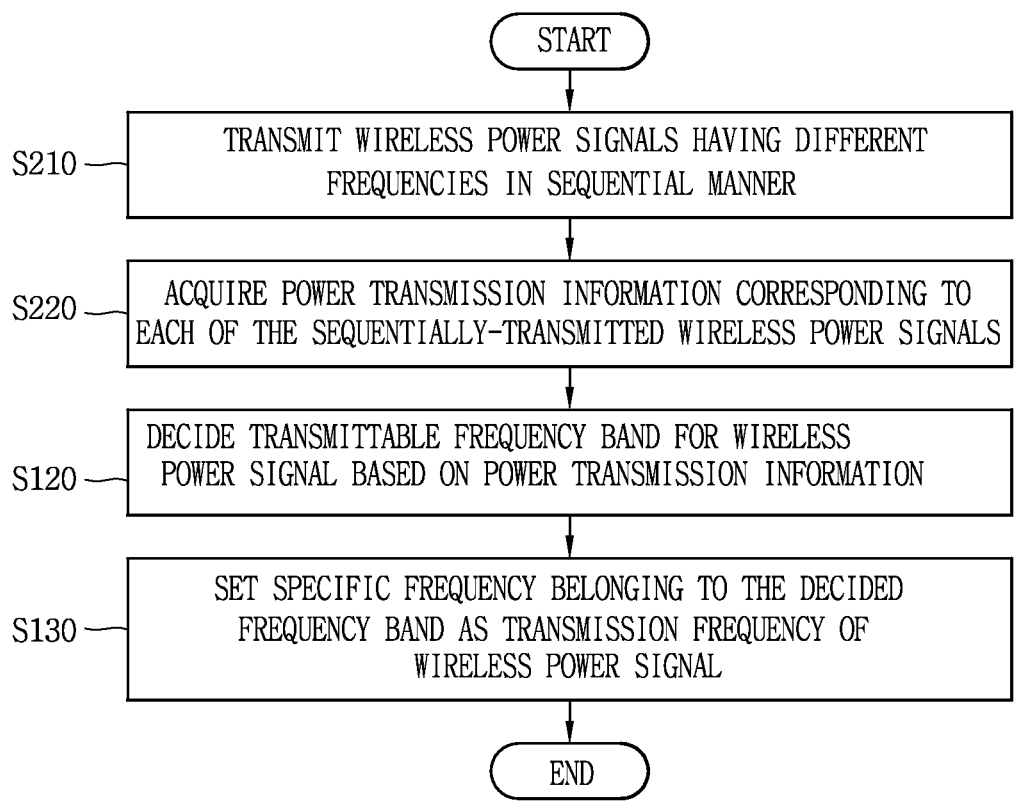
FIG. 24 is a flowchart illustrating a method for setting a frequency of a wireless power signal in accordance with a first exemplary embodiment disclosed herein.

FIG. 24 is a flowchart illustrating a method for setting a frequency of a wireless power signal in accordance with the first exemplary embodiment disclosed herein.

As illustrated in FIG. 24, a method for setting a frequency of a wireless power signal according to the first exemplary embodiment may include the following steps.

First, the wireless power transmitter 100 may sequentially transmit wireless power signals having different frequencies from one another (S210).

The wireless power transmitter 100 may then acquire power transmission information corresponding to each of the sequentially-transmitted wireless power signals (S220).

The wireless power transmitter 100 may decide a transmittable frequency band for the wireless power signal based on the power transmission information (S120).

The wireless power transmitter 100 may set a specific frequency belonging to the decided frequency band as the transmission frequency of the wireless power signal (S130).

As aforementioned, the power transmission information acquiring method as illustrated in the first exemplary embodiment may be referred to as the frequency scanning.

Second Embodiment—Decision of Frequency Band Based on Transmission Profile

A second exemplary embodiment disclosed herein may be implemented by part or combination of components or steps included in the aforementioned embodiments or by combination of those embodiments. Hereinafter, repetitive parts will be omitted to clearly express the second exemplary embodiment disclosed herein.

A method for setting a frequency of a wireless power signal in accordance with a second exemplary embodiment disclosed herein may include acquiring power transmission information from a wireless power receiver which receives the wireless power signal, and setting a transmission frequency of the wireless power signal based on the acquired power transmission information.

In accordance with the second exemplary embodiment, the acquiring of the power transmission information may include transmitting wireless power signals having different frequencies in a sequential manner, and acquiring power transmission information corresponding to each of the sequentially-transmitted wireless power signals.

Also, in accordance with the second exemplary embodiment, the setting of the transmission frequency may include deciding a transmittable frequency band for the wireless power signal based on the power transmission information, and setting a specific frequency belonging to the decided frequency band as the transmission frequency of the wireless power signal.

In addition, in accordance with the second exemplary embodiment, the deciding of the transmittable frequency band for the wireless power signal may include generating a transmission profile based upon the power transmission information, and deciding the transmittable frequency band for the wireless power signal based on the transmission profile.

Figure 25:
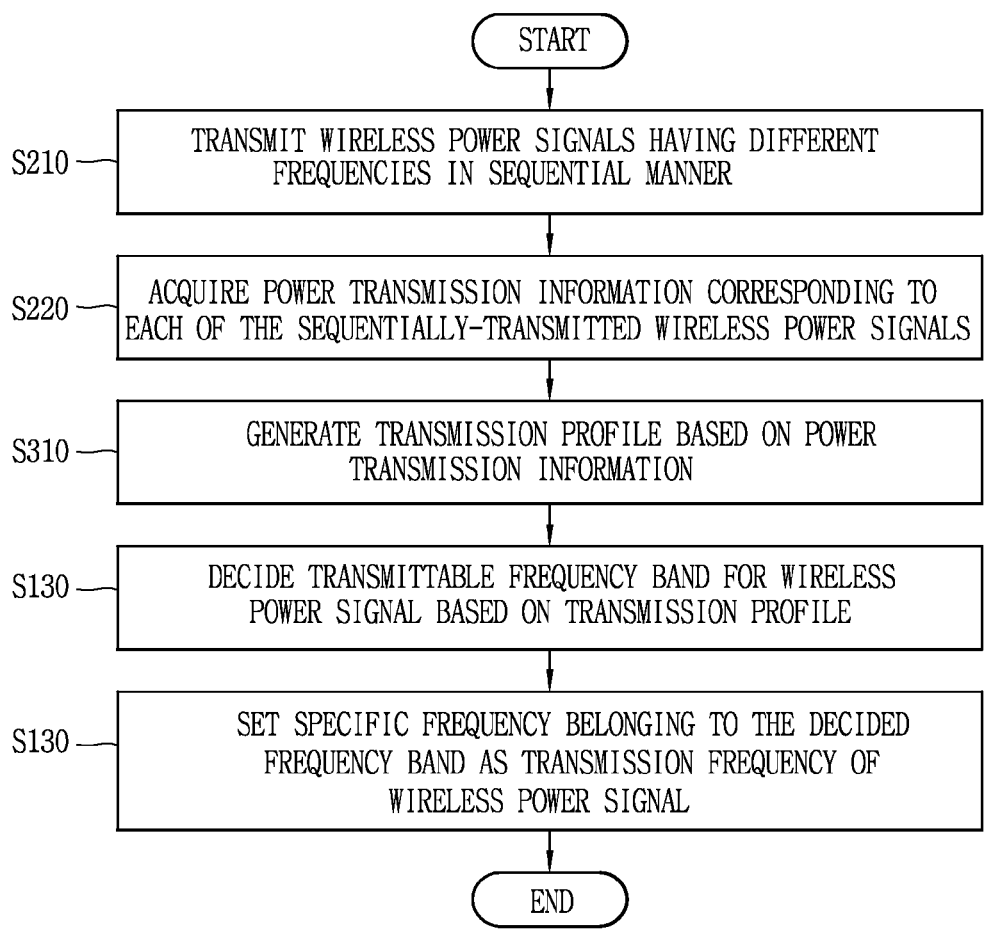
FIG. 25 is a flowchart illustrating a method for setting a frequency of a wireless power signal in accordance with a second exemplary embodiment disclosed herein.

FIG. 25 is a flowchart illustrating a method for setting a frequency of a wireless power signal in accordance with a second exemplary embodiment disclosed herein.

As illustrated in FIG. 25, a method for setting a frequency of a wireless power signal in accordance with a second exemplary embodiment disclosed herein may include the following steps.

The wireless power transmitter 100 may transmit wireless power signals having different frequencies in a sequential manner (S210).

The wireless power transmitter 100 may acquire power transmission information corresponding to each of the sequentially-transmitted wireless power signals (S220).

The wireless power transmitter 100 may generate a transmission profile based upon the power transmission information (S310).

The wireless power transmitter 100 may decide a transmittable frequency band for the wireless power signal based upon the transmission profile (S320).

The wireless power transmitter 100 may set a specific frequency belonging to the decided frequency band as a transmission frequency of the wireless power signal (S330).

As aforementioned, the power transmission information may include information related to at least one of a receiving side voltage of the wireless power receiver, a receiving side current of the wireless power receiver, a first reference voltage and a second reference voltage.

Also, the first reference voltage may be decided based on whether it is a voltage which is likely to cause damage on the wireless power receiver, and the second reference voltage may be decided based on whether it is a voltage by which the wireless power receiver can receive power from the wireless power transmitter in a wireless manner.

Figure 26:
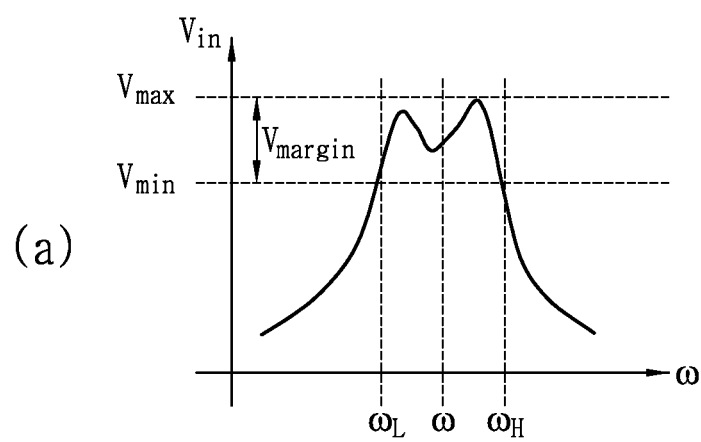
FIG. 26 is an exemplary view illustrating a transmission profile in accordance with the second exemplary embodiment disclosed herein.
Figure 26:
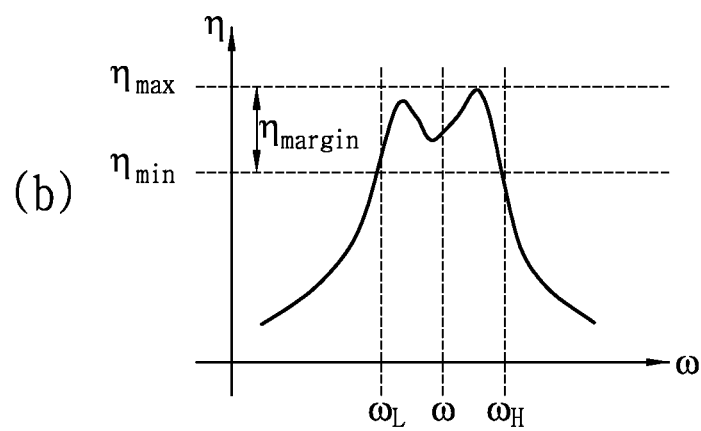
Figure 26:
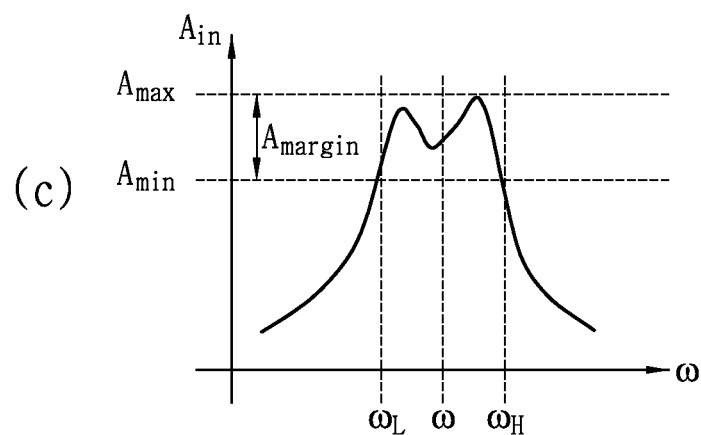

FIG. 26 is an exemplary view illustrating a transmission profile in accordance with the second exemplary embodiment disclosed herein.

As illustrated in FIG. 26, the transmission profile may indicate a relationship between at least one of the receiving side voltage, transmission efficiency and transmission gain and a frequency of the wireless power signal.

As illustrated in (a) of FIG. 26, the transmission profile may indicate a relationship between a frequency ω of a wireless power signal and a receiving side voltage $V_{in}$ of the wireless power receiver 200.

In this case, it can be noticed that the change in the frequency ω of the wireless power signal brings about the change in the receiving side voltage $V_{in}$.

Here, $V_{max}$ denotes a maximum receiving side voltage on the transmission profile. $V_{min}$ denotes a minimum receiving side voltage on the transmission profile, so as to indicate a minimum voltage for the wireless power receiver 200 to receive wireless power from the wireless power transmitter. For example, the second reference voltage may be the $V_{min}$.

Also, low-limit frequencies $ω_L$ and $ω_H$ may refer to frequencies at which the receiving side voltage is equal to $V_{min}$.

As illustrated in (b) of FIG. 26, the transmission profile may indicate a relationship between a frequency ω of a wireless power signal and transmission efficiency η.

In this case, it can be noticed that the change in the frequency ω of the wireless power signal brings about the change in the transmission efficiency η.

Here, $η_{max}$ denotes a maximum transmission efficiency on the transmission profile, and $η_{min}$ denotes a minimum transmission efficiency on the transmission profile.

For example, the transmission efficiency η may be $η_{min}$ when the receiving side voltage is the second reference voltage.

Also, low-limit frequencies $ω_L$ and $ω_H$ may refer to frequencies at which the transmission efficiency η is equal to $η_{min}$.

According to the second exemplary embodiment, the transmission efficiency may be a ratio between transmitted power of the wireless power transmitter 100 and received power of the wireless power receiver 200.

Also, the received power may be detected based on the receiving side voltage information and the receiving side current information. For example, the wireless power transmitter 100 may calculate the received power by multiplying the received side voltage value by the receiving side current value, included in the acquired power transmission information.

As illustrated in (c) of FIG. 26, the transmission profile may indicate a relationship between a frequency ω of a wireless power signal and a transmission gain (or transmission margin) A.

In this case, it can be noticed that the change in the frequency ω of the wireless power signal brings about the change in the transmission gain A.

Here, $A_{max}$ denotes a maximum transmission gain on the transmission profile, and $A_{min}$ denotes a minimum transmission gain on the transmission profile.

For example, the transmission gain A may be $A_{min}$ when the receiving side voltage is the second reference voltage.

Also, low-limit frequencies $ω_L$ and $ω_H$ may refer to frequencies at which the transmission gain A is equal to $A_{min}$.

According to the second exemplary embodiment, the transmission gain A may be a ratio between a transmitting side voltage of the wireless power transmitter and the receiving side voltage.

Hereinafter, description will be given of a method for deciding a frequency band for the wireless power signal in case where the transmission profile indicates the relationship between the frequency ω of the wireless power signal and the receiving side voltage $V_{in}$ of the wireless power receiver 200, with reference to FIGS. 27 and 28.

Figure 27:
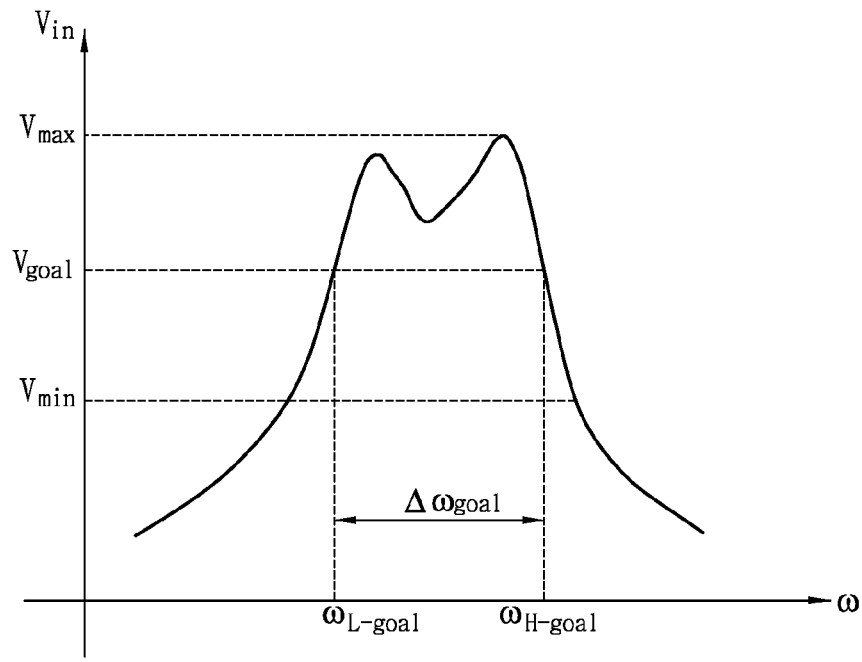
FIG. 27 is an exemplary view illustrating a frequency band deciding method for a wireless power signal in accordance with the second exemplary embodiment disclosed herein.

FIG. 27 is an exemplary view illustrating a frequency band deciding method for a wireless power signal in accordance with the second exemplary embodiment disclosed herein.

As illustrated in FIG. 27. the wireless power transmitter 100 may decide a goal frequency band $ω_{goal}$ at which the receiving side voltage $V_{in}$ can be more than a goal receiving side voltage $V_{goal}$, which is present between the maximum receiving side voltage $V_{max}$ and the minimum receiving side voltage $V_{min}$, on the transmission profile indicating the relationship between the frequency ω of the wireless power signal and the receiving side voltage $V_{in}$ of the wireless power receiver 200.

Here, the wireless power transmitter 100 may set a specific frequency belonging to the goal frequency band as the transmission frequency of the wireless power signal.

The specific frequency may be decided according to various references (basis, conditions). For example, the specific frequency may be decided such that at least one of the received side voltage, the transmission efficiency and the transmission gain can be maximized.

Figure 28:
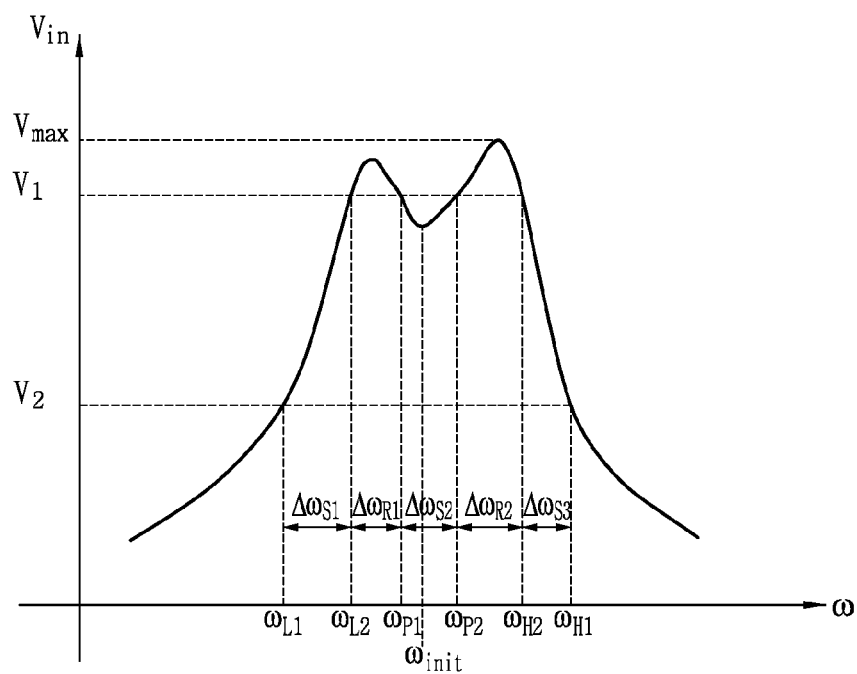
FIG. 28 is an exemplary view illustrating a frequency band deciding method for a wireless power signal in accordance with the second exemplary embodiment disclosed herein.

FIG. 28 is an exemplary view illustrating a frequency band deciding method for a wireless power signal in accordance with the second exemplary embodiment disclosed herein.

As illustrated in FIG. 28, the wireless power transmitter 100 may decide a transmittable frequency band for the wireless power signal based on a first reference voltage V1 and a second reference voltage V2 included in the power transmission information, on the transmission profile indicating the relationship between the frequency ω of the wireless power signal and the receiving side voltage $V_{in}$ of the wireless power receiver 200.

According to the second exemplary embodiment, the first reference voltage V1 may be decided based on whether it is a voltage which is likely to cause damage on the wireless power receiver, and the second reference voltage V2 may be decided based on whether it is a voltage by which the wireless power receiver can receive power from the wireless power transmitter in a wireless manner.

Also, according to the second exemplary embodiment, the transmittable frequency band for the wireless power signal may be a frequency band belonging to a range in which the receiving side voltage is less than the first reference voltage V1 and more than the second reference voltage V2.

Specifically, on the transmission profile of FIG. 28, $\Delta\omega_{s1}$ $(\omega_{L1}\sim\omega_{L2})$, $\Delta\omega_{s2}(\omega_{p1}\sim\omega_{p2})$, and $\Delta\omega_{s3}(\omega_{H1}\sim\omega_{H2})$, which are frequency ranges present between the first reference voltage V1 and the second reference voltage V2, may be selectable (or transmittable) frequency regions.

The wireless power transmitter 100 may decide at least one of $\Delta\omega_{s1}(\omega_{L1}\sim\omega_{L2})$, $\Delta\omega_{s2}(\omega_{p1}\sim\omega_{p2})$, and $\Delta\omega_{s3}$ $(\omega_{H1}\sim\omega_{H2})$ as the selectable frequency band.

Here, $\Delta\omega r_1(\omega_{L2}\sim\omega_{p1})$ and $\Delta\omega_{s2}(\omega\sim\omega_{p2})$ are frequency regions in which damages in the wireless power receiver 200 (for example, receiving circuit or rectifier) may be caused, namely, may be transmission-restricted frequency regions.

Also, according to the second exemplary embodiment, the wireless power transmitter 100 may set a specific frequency within the decided frequency band as the transmission frequency of the wireless power signal.

Also, according to the second exemplary embodiment, the specific frequency may be decided such that the receiving side voltage can be the highest thereat.

For example, the wireless power transmitter 100 may decide the frequency region (band) $\Delta\omega_{s2}(\omega_{p1}\sim\omega_{p2})$, which is a region including a transmission frequency $\omega_{init}$ preset at the beginning of an operation, as the selectable frequency band, among $\Delta\omega_{s1}(\omega_{L1}\sim\omega_{L2})$, $\Delta\omega_{s2}(\omega_{p1}\sim\omega_{p2})$, and $\Delta\omega_{s3}$ $(\omega_{H1}\sim\omega_{H2})$. Also, the wireless power transmitter 100 may select $\omega_{p1}$, which is close to $\omega_{init}$, as the specific frequency, from $\omega_{p1}$ and $\omega_{p2}$ which are frequencies corresponding to the highest receiving side voltage in the frequency region $\Delta\omega_{s2}(\omega_{p1}\sim\omega_{p2})$.

Here, $\omega_{init}$ may be a preset value by considering a resonant frequency used for wireless power transfer or a central frequency on the transmission profile. Therefore, the selection of $\omega_{p1}$ close to $\omega_{init}$ may be the most efficient and stable selection in view of the wireless power transfer.

Third Embodiment—Acquisition Time Point of Power Transmission Information (Update of Power Transmission Information A third exemplary embodiment disclosed herein may be implemented by part or combination of components or steps included in the aforementioned embodiments or by combination of those embodiments. Hereinafter, repetitive parts will be omitted to clearly express the third exemplary embodiment disclosed herein.

A method for setting a frequency of a wireless power signal in accordance with a third exemplary embodiment disclosed herein may include acquiring power transmission information from a wireless power receiver which receives the wireless power signal, and setting a transmission frequency of the wireless power signal based on the acquired power transmission information.

According to the third exemplary embodiment, the acquisition of the power transmission information may be done at various time points. For example, the acquisition of the power transmission information may be carried out at an initial operation mode of the wireless power transmitter 100.

Also, for example, the acquisition of the power transmission information may be carried out in a specific case. The acquisition operation of the power transmission information in the specific case may be referred to as an update operation of the power transmission information, as compared with the case in the initial operation mode.

According to the third exemplary embodiment, the specific case may indicate a case where at least one of the receiving side voltage, the transmission efficiency and the transmission gain is less than a reference voltage, a case where a new wireless power receiver is arranged in a specific region, a case where the number of wireless power receivers within the specific region changes, a case where at least one wireless power receiver within the specific region changes in location, a case where the acquisition is carried out in a periodic manner, or a case where there is a request received from the wireless power receiver.

Here, the specific region may refer to a region through which the wireless power signal passes, or a region where the wireless power receiver 200 is detected.

Figure 29:
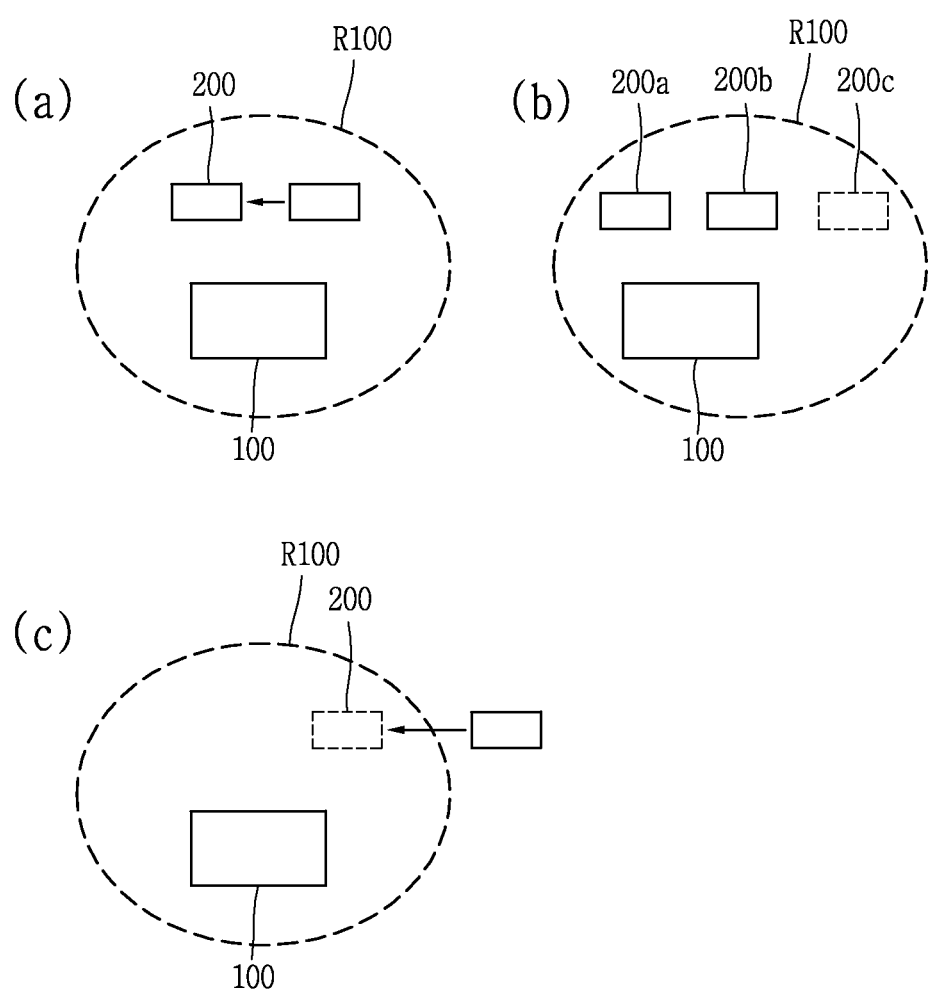
FIG. 29 is an exemplary view illustrating a case of acquiring power transmission information in accordance with a third exemplary embodiment disclosed herein.

FIG. 29 is an exemplary view illustrating a case of acquiring power transmission information in accordance with a third exemplary embodiment disclosed herein.

As illustrated in (a) of FIG. 29, when the wireless power receiver 200 located in a specific region R100 changes in location, the wireless power transmitter 100 may acquire the power transmission information (or the power transmission information may be updated).

As illustrated in (b) of FIG. 29, when the number of wireless power receivers within the specific region R100 changes, the wireless power transmitter 100 may acquire the power transmission information. That is, while a first receiver 200a and a second receiver 200b are present in the specific region R100, if a third receiver 300c enters the specific region R100 or is detected as a receiver which can receive power in a wireless manner, the wireless power transmitter 100 may acquire the power transmission information.

As illustrated in (c) of FIG. 29, when a new wireless power receiver 200 enters the specific region 8100 (or an arrangement of the new wireless power receiver 200 has been detected), the wireless power transmitter 100 may acquire the power transmission information.

Fourth Embodiment—a Case where a Plurality of Wireless Power Transmitter are Present A fourth exemplary embodiment disclosed herein may be implemented by part or combination of components or steps included in the aforementioned embodiments or by combination of those embodiments. Hereinafter, repetitive parts will be omitted to clearly express the fourth exemplary embodiment disclosed herein.

A method for setting a frequency of a wireless power signal in accordance with a fourth exemplary embodiment disclosed herein may include acquiring power transmission information from a wireless power receiver which receives the wireless power signal, and setting a transmission frequency of the wireless power signal based on the acquired power transmission information.

According to the fourth exemplary embodiment, the setting of the transmission frequency may include deciding a transmittable frequency band for the wireless power signal based on the power transmission information, and setting a specific frequency belonging to the decided frequency band as the transmission frequency of the wireless power signal.

According to the fourth exemplary embodiment, the wireless power receiver may be provided in plurality, and the deciding of the transmittable frequency band for the wireless power signal may include generating a plurality of transmission profiles corresponding to the plurality of wireless power receivers, respectively, based on the power transmission information, and deciding the transmittable frequency band for the wireless power signal based on the plurality of transmission profiles.

According to the fourth exemplary embodiment, the deciding of the transmittable frequency band for the wireless power signal based on the plurality of transmission profiles may include selecting at least one transmission profile from the plurality of transmission profiles, and deciding the transmittable frequency band for the wireless power signal based on the selected at least one transmission profile.

According to the fourth exemplary embodiment, the selection of the at least one transmission profile from the plurality of transmission profiles may be carried out based on at least one of whether it is a transmission profile which is likely which is likely to cause damage on the wireless power receiver, and whether it is a transmission profile by which the wireless power receiver is able to receive power from the wireless power transmitter in a wireless manner.

According to the fourth exemplary embodiment, the deciding of the transmittable frequency band for the wireless power signal based on the plurality of transmission profiles may include generating a reference transmission profile based on the plurality of transmission profiles, and deciding the transmittable frequency band for the wireless power signal based on the generated reference transmission profile.

According to the fourth exemplary embodiment, the reference transmission profile may be generated by processing the plurality of transmission profiles in a statistical manner.

According to the fourth exemplary embodiment, the statistical method may be a method based on at least one of an average, distribution, and standard deviation of the plurality of transmission profiles.

Figure 30:
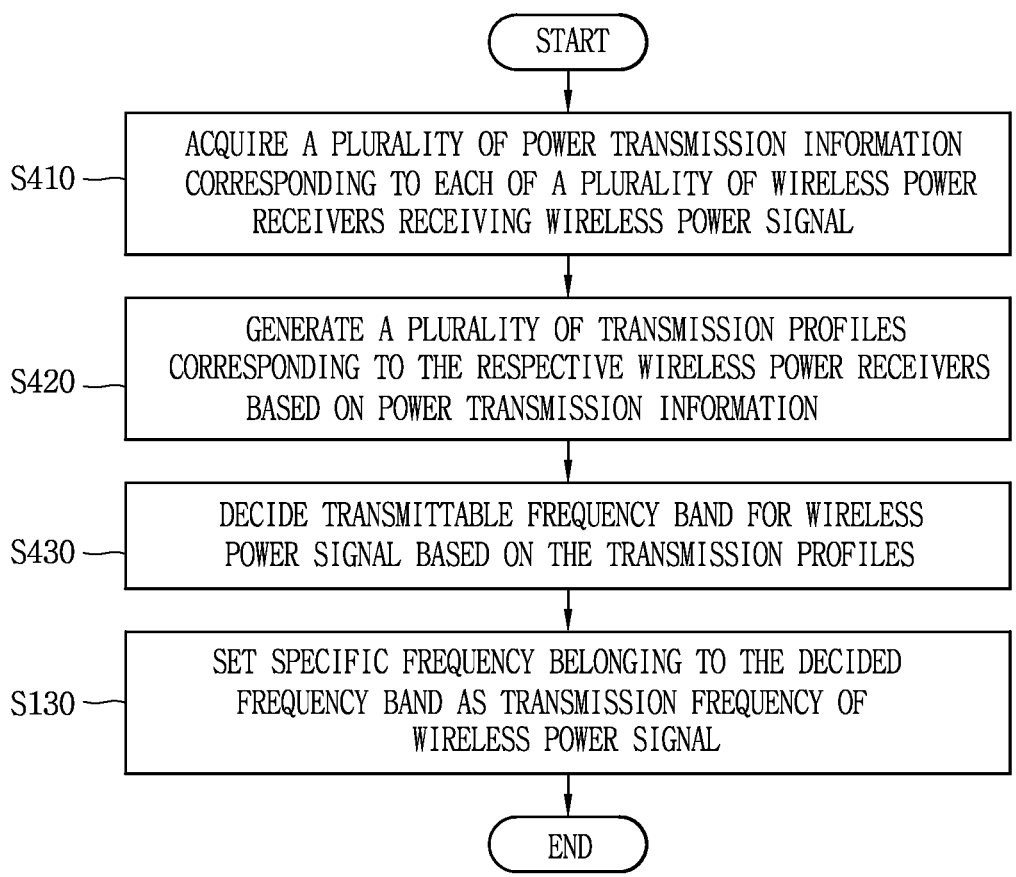
FIG. 30 is a flowchart illustrating a method for setting a frequency of a wireless power signal in accordance with a fourth exemplary embodiment disclosed herein.

FIG. 30 is a flowchart illustrating a method for setting a frequency of a wireless power signal in accordance with a fourth exemplary embodiment disclosed herein.

As illustrated in FIG. 30, a method for setting a frequency of a wireless power signal according to the fourth exemplary embodiment may include the following steps.

First, the wireless power transmitter 100 may acquire a plurality of power transmission information corresponding to each of a plurality of wireless power receivers which receive a wireless power signal (S410).

The wireless power transmitter 100 may generate a plurality of transmission profiles corresponding to a plurality of wireless power receivers, respectively, based on the acquired power transmission information (S420).

The wireless power transmitter 100 may decide a transmittable frequency band for the wireless power signal based on the plurality of transmission profiles (S430).

The wireless power transmitter 100 may set a specific frequency belonging to the decided frequency band as a transmission frequency of the wireless power signal (S130).

Figure 31:
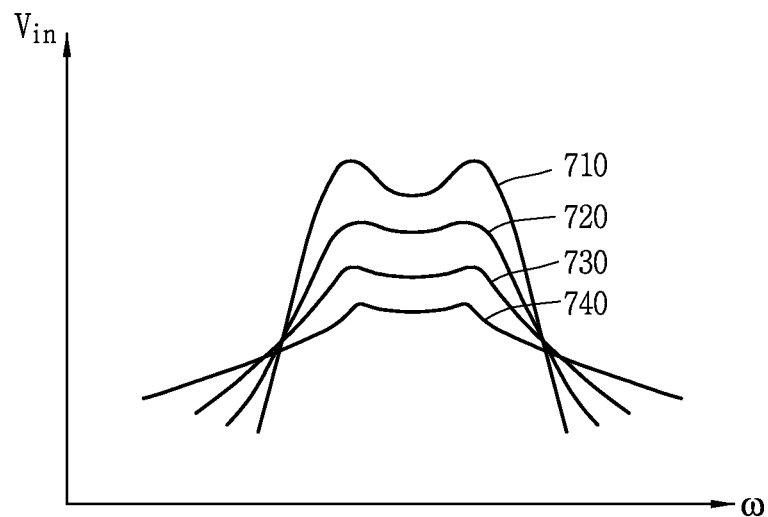
FIG. 31 is an exemplary view illustrating a method for setting a frequency of a wireless power signal in accordance with the fourth exemplary embodiment disclosed herein.

FIG. 31 is an exemplary view illustrating a method for setting a frequency of a wireless power signal in accordance with the fourth exemplary embodiment disclosed herein.

As illustrated in FIG. 31, the wireless power transmitter 100 may generate a plurality of transmission profiles 710 to 740 corresponding to a plurality of wireless power receivers, which are located within the specific region R100.

Here, the specific region may be a region through which the wireless power signal passes, or a region where the plurality of wireless power receivers are detectable.

According to the fourth exemplary embodiment, the wireless power transmitter 100 may select at least one transmission profile from the plurality of transmission profiles 710 to 740, and decide the transmittable frequency band for the wireless power signal based on the selected at least one transmission profile.

According to the fourth exemplary embodiment, the selection of the at least one transmission profile from the plurality of transmission profiles 710 to 740 may be carried out based on at least one of whether it is a transmission profile which is likely to cause damage on the wireless power receiver, and whether it is a transmission profile by which the wireless power receiver is able to receive power from the wireless power transmitter in a wireless manner.

In the case illustrated in FIG. 31, the wireless power transmitter 100 may select a first transmission profile 710 which may have the highest probability of causing the damage and a second transmission profile 740 which may have the lowest probability that the wireless power receiver wirelessly receives power (or being likely to have the lowest transmission efficiency or transmission gain), from the plurality of transmission profiles 710 to 740.

For example, since the first transmission profile 710 exhibits the highest distribution level of the receiving side voltage of the wireless power receiver, it may have the highest probability of causing the damage. Also, since the second transmission profile 740 exhibits the lowest distribution level of the receiving side voltage of the wireless power receiver, it may have the lowest probability that the wireless power receiver wirelessly receives power.

Also, according to a varied fourth exemplary embodiment, the wireless power transmitter 100 may select a transmission profile corresponding to a wireless power receiver, which is present at the nearest location to the wireless power transmitter within a specific region R400, and a transmission profile corresponding to a wireless power receiver which is present at the farthest location from the wireless power transmitter 100 within the specific region R400.

Figure 32:
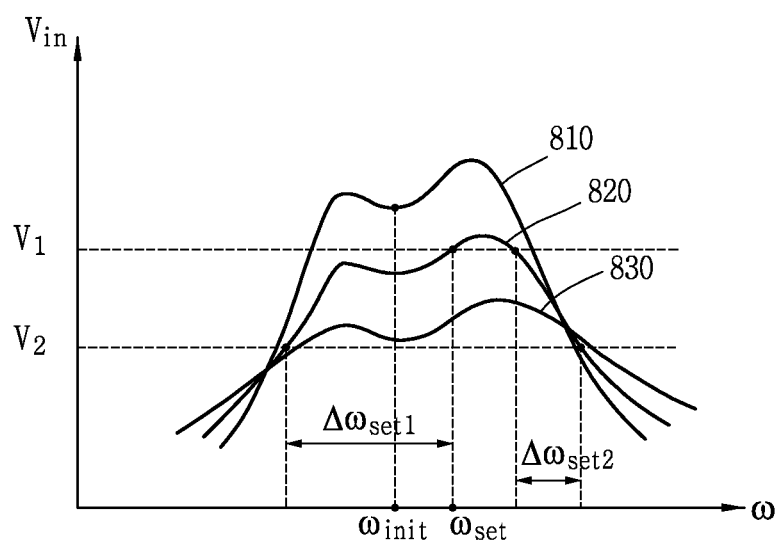
FIG. 32 is an exemplary view illustrating a method for setting a frequency of a wireless power signal in accordance with the fourth exemplary embodiment disclosed herein.

FIG. 32 is an exemplary view illustrating a method for setting a frequency of a wireless power signal in accordance with the fourth exemplary embodiment disclosed herein.

As illustrated in FIG. 32, the wireless power transmitter 100 may generate a reference transmission profile 820 based on a plurality of profiles 810 and 830.

Also, the wireless power transmitter 100 may decide transmittable frequency bands $\Delta\omega_{set1}$ and $\Delta\omega_{set2}$ for the wireless power signal based on the generated reference transmission profile 820.

The wireless power transmitter 100 may decide $\Delta\omega_{set1}$, which is a frequency region including $\omega_{init}$, of the frequency bands $\Delta\omega_{set1}$ and $\Delta\omega_{set2}$, as a frequency band. Also, the wireless power transmitter 100 may set $\Delta\omega_{set}$, which is a frequency the closest to $\omega_{init}$ and has the highest receiving side voltage $V_{in}$ within the region $\Delta\omega_{set1}$, as the transmission frequency of the wireless power signal.

Specifically, the wireless power transmitter 100 may generate the reference transmission profile 820 by processing the plurality of profiles 810 and 830 in a statistical manner.

The statistical processing for the plurality of profiles 810 and 830 may be carried out in various manners. For example, the statistical method may be a method based on at least one of an average, distribution, and standard deviation of the plurality of transmission profiles 810 and 830. Also, it may be obvious to those skilled in the art that other various statistical methods may be applied to a frequency setting method for a wireless power signal according to one exemplary embodiment disclosed herein.

FIG. 32 illustrates a case where the wireless power transmitter 100 decides an average transmission profile of the third transmission profile 810 and the fourth transmission profile 830 as the reference transmission profile 820.

In this case, the wireless power transmitter 100 may decide $\Delta\omega_{set1}$ as the transmittable frequency band, of $\Delta\omega_{set1}$ and $\Delta\omega_{set2}$, which are frequency regions in which the receiving side voltage is present between the first reference voltage V1 and the second reference voltage V2 on the reference transmission profile 820.

According to the fourth exemplary embodiment, the first reference voltage V1 may be decided based on whether it is a voltage which is likely to cause damage on the wireless power receiver, and the second reference voltage V2 may be decided based on whether it is a voltage by which the wireless power receiver can receive power from the wireless power transmitter in a wireless manner.

The aforementioned method may be implemented in a recording medium readable by a computer or its similar devices by employing, for example, software, hardware or some combinations thereof.

For a hardware implementation, the embodiments described herein may be implemented by using at least any one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and other electronic units designed to perform the functions described herein. For example, the foregoing methods may be implemented by the control unit (or Controller) 180 or power transmission control unit 112 of the wireless power transmitter 100.

For a software implementation, the embodiments such as procedures and functions disclosed herein may be implemented with separate software modules. Each of the software modules may perform one or more of the functions and operations described herein. Software codes may be implemented by using a software application written in a suitable programming language. The software codes may be stored in the memory 150 in the wireless power transmitter 100, and implemented by the control unit (or Controller) 180 or the power transmission control unit 112.

However, it would be easily understood by those skilled in the art that the configuration of a wireless power transmitter according to the embodiment disclosed herein may be applicable to an apparatus, such as a docking station, a terminal cradle device, and an electronic device, and the like, excluding a case where it is applicable to only a wireless charger.

The scope of the invention will not be limited to the embodiments disclosed herein, and thus various modifications, variations, and improvements can be made in the present invention without departing from the spirit of the invention, and within the scope of the appended claims.

The invention claimed is:

1. A frequency setting method in a wireless power transmitter, for setting a frequency of a wireless power signal transmitted by the wireless power transmitter, the method comprising:
acquiring power transmission information from a wireless power receiver which receives the wireless power signal; and
setting a transmission frequency of the wireless power signal based on the acquired power transmission information,
wherein the setting of the transmission frequency comprises:
generating a plurality of transmission profiles corresponding to a plurality of wireless power receivers, respectively, based on the power transmission information;
generating a reference transmission profile based on the plurality of transmission profiles; and
deciding a transmittable frequency band for the wireless power signal based on the generated reference transmission profile, and
wherein the reference transmission profile is generated by processing the plurality of transmission profiles in a statistical manner.

2. The method of claim 1, wherein the acquiring of the power transmission information comprises:
transmitting wireless power signals having different frequencies in a sequential manner; and
acquiring power transmission information corresponding to each of the sequentially-transmitted wireless power signals.

3. The method of claim 1, wherein the power transmission information comprises information related to at least one of a receiving side voltage of the wireless power receiver, a receiving side current of the wireless power receiver, a first reference voltage and a second reference voltage.

4. The method of claim 3, wherein the first reference voltage is decided based on whether it is a voltage which is likely to cause damage on the wireless power receiver, and
wherein the second reference voltage is decided based on whether it is a voltage by which the wireless power receiver can receive power from the wireless power transmitter in a wireless manner.

5. The method of claim 3, wherein the setting of the transmission frequency comprises:
deciding a transmittable frequency band for the wireless power signal based on the power transmission information; and
setting a specific frequency belonging to the decided frequency band as the transmission frequency of the wireless power signal.

6. The method of claim 5, wherein the transmittable frequency band is a frequency band corresponding to a range where the receiving side voltage is less than the first reference voltage and more than the second reference voltage.

7. The method of claim 5, wherein the deciding of the transmittable frequency band for the wireless power signal comprises:
generating a transmission profile based on the power transmission information; and
deciding the transmittable frequency band of the wireless power signal based on the transmission profile.

8. The method of claim 7, wherein the transmission profile indicates a relationship between at least one of the receiving side voltage, transmission efficiency and transmission gain and a frequency of the wireless power signal.

9. The method of claim 7, wherein the specific frequency is decided such that at least one of the receiving side voltage, transmission efficiency and transmission gain has the maximum value.

10. The method of claim 5, wherein the power transmission information is acquired when at least one of the receiving side voltage, transmission efficiency and transmission gain is below a reference value, when a new wireless power receiver is arranged within a specific region, when the number of wireless power receivers within the specific region changes, when at least one wireless receiver within the specific region changes in location, when the acquisition is carried out in a periodical manner, or when there is a request received from the wireless power receiver, and wherein the specific region is a region through which the wireless power signal passes, or a region where the wireless power receiver is detectable.

11. The method of claim 8, wherein the transmission efficiency is a ratio between transmitted power of the wireless power transmitter and received power of the wireless power receiver, wherein the transmission gain is a ratio between a transmitting side voltage of the wireless power transmitter and the receiving side voltage, and wherein the received power is detected based on the receiving side voltage information and the receiving side current information.

12. The method of claim 5, further comprising storing the decided frequency band.

13. The method of claim 1, wherein the deciding of the transmittable frequency band for the wireless power signal based on the plurality of transmission profiles comprises:

selecting at least one transmission profile from the plurality of transmission profiles; and deciding the transmittable frequency band for the wireless power signal based on the selected at least one transmission profile.

14. The method of claim 13, wherein the selection of the at least one transmission profile from the plurality of transmission profiles is carried out based on at least one of whether it is a transmission profile which is likely to cause damage on the wireless power receiver, and whether it is a transmission file by which the wireless power receiver can wirelessly receive power from the wireless power transmitter.

15. The method of claim 1, wherein the statistical manner is a method performed based on at least one of an average, distribution, and standard deviation of the plurality of transmission profiles.

16. A wireless power transmitter comprising:

a power transfer unit that is configured to transmit a wireless power signal, and acquire power transmission information from a wireless power receiver which receives the wireless power signal; and a controller that is configured to decide a transmittable frequency band for the wireless power signal based on the power transmission information, set a specific frequency belonging to the decided frequency band as a transmission frequency of the wireless power signal, and transmit the wireless power signal corresponding to the set transmission frequency to the wireless power receiver, wherein the controller is further configured to:

generate a plurality of transmission profiles corresponding to a plurality of wireless power receivers, respectively, based on the power transmission information, generate a reference transmission profile based on the plurality of transmission profiles, and decide a transmittable frequency band for the wireless power signal based on the generated reference transmission profile, and wherein the reference transmission profile is generated by processing the plurality of transmission profiles in a statistical manner.

17. The transmitter of claim 16, wherein the power transfer unit transmits wireless power signals having different frequencies in a sequential manner, and acquires power transmission information corresponding to each of the sequentially-transmitted wireless power signals.

* * * * *